(12) United States Patent
Bok et al.

(10) Patent No.: US 12,366,900 B2
(45) Date of Patent: Jul. 22, 2025

(54) ELECTRONIC DEVICE

(71) Applicant: Samsung Display Co., Ltd., Yongin-si (KR)

(72) Inventors: Seung-Lyong Bok, Hwaseong-si (KR); Dongho Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 385 days.

(21) Appl. No.: 17/945,091

(22) Filed: Sep. 15, 2022

(65) Prior Publication Data

US 2023/0084437 A1  Mar. 16, 2023

(30) Foreign Application Priority Data

Sep. 16, 2021  (KR) .................. 10-2021-0124104

(51) Int. Cl.
*G06F 1/16* (2006.01)
*H10K 50/84* (2023.01)
(Continued)

(52) U.S. Cl.
CPC .......... *G06F 1/1684* (2013.01); *G06F 1/1616* (2013.01); *G06F 1/1643* (2013.01);
(Continued)

(58) Field of Classification Search
CPC .... G06F 1/1616; G06F 1/1643; G06F 1/1652; H10K 59/12; H10K 59/17; H10K 59/124; H10K 59/126; G09G 2380/02
See application file for complete search history.

(56) References Cited

U.S. PATENT DOCUMENTS 10,564,744 B2 * 2/2020 Sohn ................. G06F 3/041
10,585,456 B2   3/2020 Sohn et al.
(Continued)

FOREIGN PATENT DOCUMENTS

CN  208607570 U  3/2019
CN  110767835 A  2/2020
(Continued)

OTHER PUBLICATIONS

Song_English (Year: 2018).*
(Continued)

*Primary Examiner* — Minsun O Harvey
*Assistant Examiner* — Alexander Ehrlich
(74) *Attorney, Agent, or Firm* — KILE PARK REED & HOUTTEMAN PLLC

(57) ABSTRACT

An electronic device includes a substrate, a circuit layer disposed on the substrate and including a plurality of insulating layers, a plurality of conductive layers, and at least one semiconductor layer, a light emitting element layer disposed on the circuit layer and including a light emitting element, an encapsulation layer disposed on the light emitting element layer, and a sensor layer disposed on the encapsulation layer and including a plurality of sensor conductive layers. A first layer of the conductive layers, the at least one semiconductor layer, and the sensor conductive layers includes a first sensor, a second layer different from the first layer of the conductive layers, the at least one semiconductor layer, and the sensor conductive layers includes a second sensor, and the first sensor and the second sensor overlap a second area.

18 Claims, 23 Drawing Sheets

(51) Int. Cl.
　　　*H10K 59/121*　　　(2023.01)
　　　*H10K 59/40*　　　(2023.01)
　　　*H10K 102/00*　　　(2023.01)

(52) U.S. Cl.
　　　CPC ........... *G06F 1/1652* (2013.01); *H10K 50/84* (2023.02); *H10K 59/1213* (2023.02); *H10K 59/40* (2023.02); *H10K 2102/311* (2023.02)

(56) References Cited

U.S. PATENT DOCUMENTS

| | | | |
|---|---|---|---|
| 10,748,970 | B2 | 8/2020 | Kim et al. |
| 11,132,087 | B2 | 9/2021 | Lee et al. |
| 2018/0053455 | A1 | 2/2018 | Zhag et al. |
| 2020/0073495 | A1 | 3/2020 | Bok et al. |
| 2020/0278312 | A1* | 9/2020 | Jeong ................. G01R 31/2837 |
| 2021/0249624 | A1 | 8/2021 | Lou et al. |

FOREIGN PATENT DOCUMENTS

| | | | | |
|---|---|---|---|---|
| CN | 111710276 | A | | 9/2020 |
| CN | 112038373 | A | * | 12/2020 |
| KR | 10-2017-0024672 | A | | 3/2017 |
| KR | 10-2017-0025620 | A | | 3/2017 |
| KR | 10-2017-0026046 | A | | 3/2017 |
| KR | 20180039797 | A | * | 4/2018 ............. G09F 9/301 |
| KR | 10-1899482 | B1 | | 9/2018 |
| KR | 10-2019-0026497 | A | | 3/2019 |
| KR | 10-2020-0027598 | A | | 3/2020 |
| KR | 20200084496 | A | * | 7/2020 ............. G06F 3/044 |
| KR | 10-2020-0143627 | A | | 12/2020 |
| KR | 20210086230 | A | * | 7/2021 ......... H01L 27/3262 |
| TW | 1618274 | B | * | 3/2018 |

OTHER PUBLICATIONS

Kim_English (Year: 2021).*
Hyun_English (Year: 2020).*
Lee_English (Year: 2018).*
Ma1_English (Year: 2020).*
Chen, Bo-Wei, et al. "Effects of Repetitive Mechanical Bending Strain on Various Dimensions of Foldable Low Temperature Polysilicon Tfts Fabricated on Polyimide." IEEE Electron Device Letters, vol. 37, No. 8, 2016, pp. 1010-1013.

* cited by examiner

ELECTRONIC DEVICE

CROSS REFERENCE TO RELATED APPLICATION

This application claims priority from and the benefit of Korean Patent Application No. 10-2021-0124104, filed on Sep. 16, 2021, which is hereby incorporated by reference for all purposes as if fully set forth herein.

BACKGROUND

Field

Embodiments of the invention relate generally to an electronic device including a foldable display panel and more specifically, to an electronic device including a foldable display panel having a strain gauge sensor.

Discussion of the Background

An electronic device includes various electronic parts such as a display panel, an electronic module, and the like. The display panel is foldable. As the display panel is repeatedly folded and unfolded, a stress is applied to the electronic device. When cracks occur due to the stress, functional defects are likely to occur in the electronic device.

The above information disclosed in this Background section is only for understanding of the background of the inventive concepts, and, therefore, it may contain information that does not constitute prior art.

SUMMARY

Electronic devices constructed according to the principles and embodiments of the invention are capable of sensing a crack occurring in a folding area of a display panel.

Electronic devices constructed according to the principles and embodiments of the invention are capable of sensing a folding angle of the display panel and controlling an operation of a display panel according to the folding angle.

Additional features of the inventive concepts will be set forth in the description which follows, and in part will be apparent from the description, or may be learned by practice of the inventive concepts.

According to an aspect of the invention, an electronic device includes a substrate including a first area, a second area adjacent to the first area in a first direction and foldable, and a third area adjacent to the second area in the first direction, a circuit layer disposed on the substrate and including a plurality of insulating layers, a plurality of conductive layers, and at least one semiconductor layer, a light emitting element layer disposed on the circuit layer and including a light emitting element, an encapsulation layer disposed on the light emitting element layer, and a sensor layer disposed on the encapsulation layer, including a plurality of sensor conductive layers, and for sensing an external input. One among the plurality of conductive layers, the at least one semiconductor layer, and the plurality of sensor conductive layers corresponds to a first layer. The first layer includes a first sensor. Another among the plurality of conductive layers, the at least one semiconductor layer, and the plurality of sensor conductive layers corresponds to a second layer different from the first layer. The second layer includes a second sensor. The first sensor and the second sensor overlap the second area.

The first sensor may be spaced apart from the second sensor in the first direction when viewed in a plane.

The first sensor may have an elasticity or a rigidity that is different from an elasticity or a rigidity of the second sensor.

The first sensor may be spaced apart from the second sensor in a second direction intersecting the first direction when viewed in a plane.

One of the first layer and the second layer may further include a third sensor, and the third sensor may be spaced apart from the first sensor and the second sensor.

The third sensor may overlap the second area.

The at least one semiconductor layer may include a first semiconductor layer including a silicon semiconductor and a second semiconductor layer including an oxide semiconductor.

The second sensor may be disposed more adjacent to the third area than the first sensor is when viewed in a plane, and the second sensor may have a rigidity greater than a rigidity of the first sensor.

The first layer may be disposed between the second layer and the substrate, and the first sensor may have an elasticity greater than an elasticity of the second sensor.

The first sensor may have a length greater than a length of the second sensor in the first direction.

The first sensor may have a length greater than a length of the second sensor in a second direction intersecting the first direction.

The circuit layer may further include a pixel circuit electrically connected to the light emitting element and a connection line connecting the light emitting element to the pixel circuit, the connection line may include a light transmissive material, and the first sensor or the second sensor may be disposed on a same layer as a layer on which the connection line is disposed.

The second area may be folded with respect to a first folding axis defined on the substrate or folded with respect to a second folding axis defined under the substrate.

The electronic device may further include a driver electrically connected to the first sensor and the second sensor, and the driver may be configured to determine whether the second area is folded with respect to the first folding axis or the second folding axis based on signals measured by the first sensor and the second sensor.

Each of the first sensor and the second sensor may be a strain gauge sensor.

According to another aspect of the invention, an electronic device includes a display layer including a substrate including a first area, a second area adjacent to the first area in a first direction and foldable, and a third area adjacent to the second area in the first direction, a circuit layer disposed on the substrate and including a plurality of insulating layers, a plurality of conductive layers, and at least one semiconductor layer, a light emitting element layer disposed on the circuit layer and including a light emitting element, and an encapsulation layer disposed on the light emitting element layer, a sensor layer disposed on the display layer, including a plurality of sensor conductive layers, and for sensing an external input, a first sensor included in a first layer corresponding to one among the conductive layers, the at least one semiconductor layer, and the sensor conductive layers, and a second sensor included in a second layer corresponding to another among the conductive layers, the at least one semiconductor layer, and the sensor conductive layers.

The display layer may further include a main display area, a first auxiliary display area, and a second auxiliary display area. The display layer may include a first pixel including a first light emitting element disposed in the first auxiliary display area and a first pixel circuit electrically connected to the first light emitting element and disposed in the second auxiliary display area, a second pixel including a second light emitting element disposed in the second auxiliary display area and a second pixel circuit electrically connected to the second light emitting element and disposed in the second auxiliary display area, a third pixel including a third light emitting element disposed in the main display area and a third pixel circuit electrically connected to the third light emitting element and disposed in the main display area, and a connection line connecting the first light emitting element to the first pixel circuit, and one of the first sensor and the second sensor may be disposed on a same layer as a layer on which the connection line is disposed and may include a same material as the connection line.

The first layer may be disposed between the second layer and the substrate, and the first sensor may have an elasticity or rigidity different from an elasticity or rigidity of the second sensor.

The first sensor may be spaced apart from the second sensor in the first direction when viewed in a plane.

The first sensor may be spaced apart from the second sensor in a second direction intersecting the first direction when viewed in a plane.

According to the above, the first sensor and the second sensor may be spaced apart from each other in the first direction or the second direction in the second area, and a position at which the crack occurs in the second area may be precisely determined. In addition, a folding angle of the display panel may be sensed by the first and second sensors, and an operation of the display panel may be controlled in accordance with the folding angle.

Further, as the first sensor and the second sensor are disposed on different layers from each other, it is possible to determine a degree of stress generated in different layers from each other in detail. In addition, reliability with respect to the degree of folding of the display panel measured through the first and second sensors may be improved.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1A:
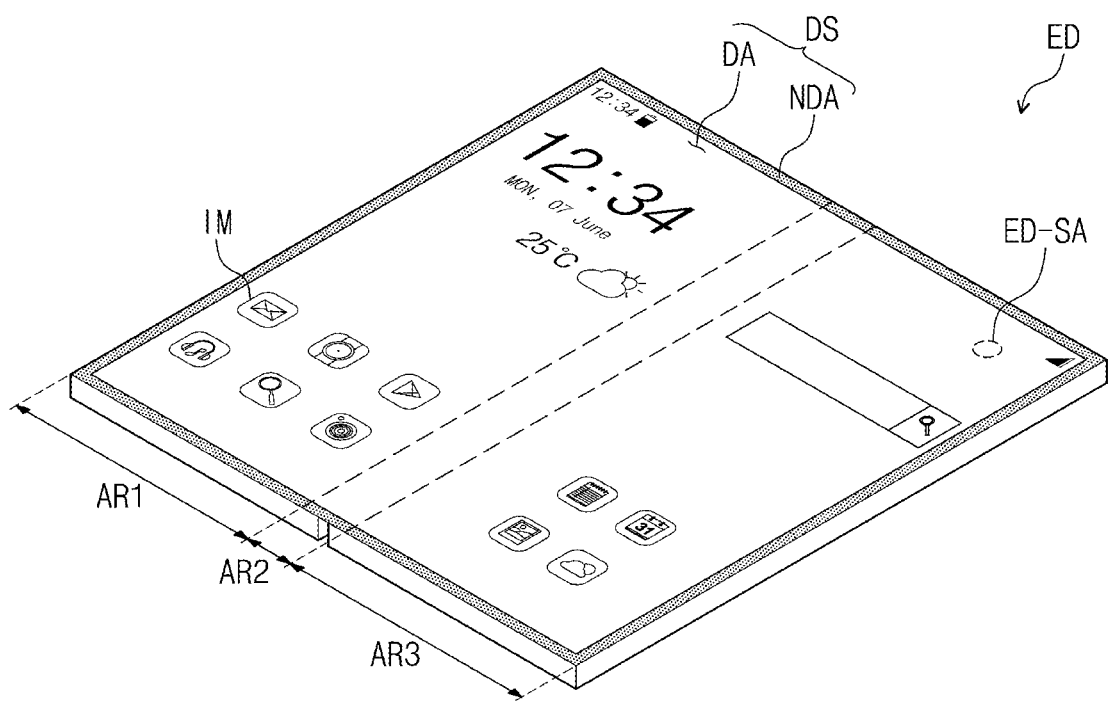
FIG. 1A is a perspective view of an embodiment of an electronic device constructed according to the principles of the invention shown in an unfolded state.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments will be explained in detail with reference to the accompanying drawings.

Figure 1B:
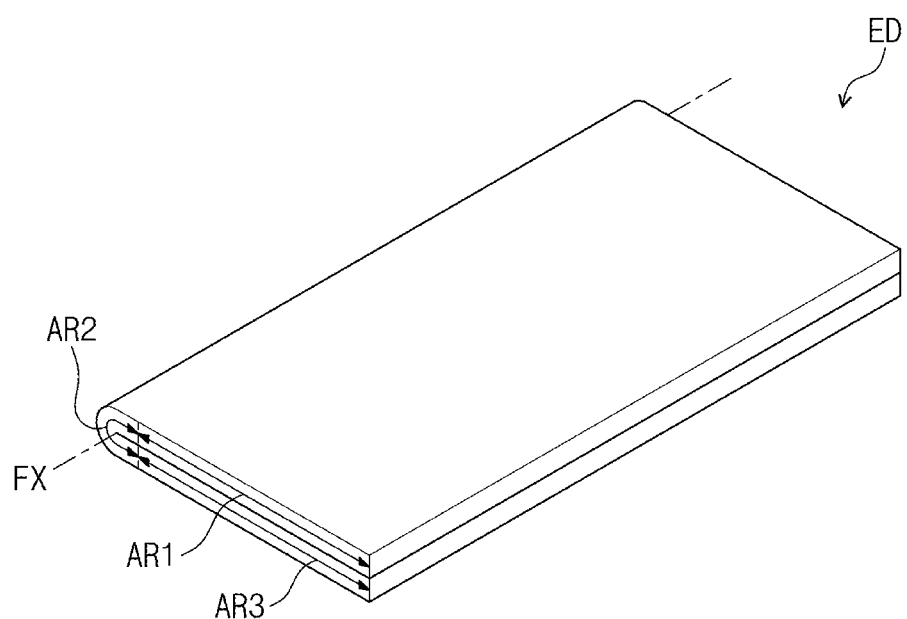
FIG. 1B is a perspective view of the electronic device of FIG. 1A shown in a folded state.
Figure 1B:
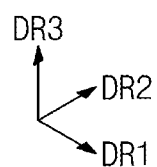

FIGS. 1A and 1B are perspective views of an electronic device ED according to an embodiment. FIG. 1A shows an unfolded state of the electronic device ED, and FIG. 1B shows a folded state of the electronic device ED.

Referring to FIGS. 1A and 1B, the electronic device ED may include a display surface DS defined by a first direction DR1 and a second direction DR2 intersecting the first direction DR1. The electronic device ED may provide an image IM to a user through the display surface DS.

The display surface DS may include a display area DA and a non-display area NDA around the display area DA. The display area DA may display the image IM, and the non-display area NDA may not display the image IM. The non-display area NDA may surround the display area DA, however, embodiments should not be limited thereto or thereby, and a shape of the display area DA and a shape of the non-display area NDA may be changed.

Hereinafter, a direction substantially perpendicular to a plane defined by the first direction DR1 and the second direction DR2 may be referred to as a third direction DR3. In the description, the expression "when viewed in a plane" may mean a state of being viewed in the third direction DR3.

A sensing area ED-SA may be defined in the display area DA of the electronic device ED. FIG. 1A shows one sensing area ED-SA as a representative example, however, the number of the sensing areas ED-SA should not be particularly limited thereto. The sensing area ED-SA may be a portion of the display area DA. Accordingly, the electronic device ED may display the image through the sensing area ED-SA.

The electronic device ED may include an electronic module disposed in an area overlapping the sensing area ED-SA. The electronic module may receive an external input provided from the outside through the sensing area ED-SA or may provide an output through the sensing area ED-SA. As an example, the electronic module may be a camera module, a sensor that measures a distance, such as a proximity sensor, a sensor that recognizes a part of a user's body, e.g., a fingerprint, an iris, or a face, or a small lamp that outputs a light, however, embodiments should not be particularly limited thereto. Hereinafter, the camera module will be described as the electronic module overlapping the sensing area ED-SA.

The electronic device ED may include a first area AR1, a second area AR2, and a third area AR3. The first area AR1, the second area AR2, and the third area AR3 may be sequentially arranged in the first direction DR1. The second area AR2 may be referred to as a foldable area, and the first and third areas AR1 and AR3 may be referred to as non-foldable areas.

As shown in FIG. 1B, the second area AR2 may be folded with respect to a folding axis FX substantially parallel to the second direction DR2. The second area AR2 may have a predetermined curvature and a radius of curvature when the electronic device ED is in the folded state. The electronic device ED may be inwardly folded (e.g., inner-folding state) such that the first area AR1 faces the third area AR3 and the display surface DS is not exposed to the outside.

According to an embodiment, the electronic device ED may be outwardly folded (e.g., outer-folding state) such that the display surface DS is exposed to the outside. According to an embodiment, the electronic device ED may be provided such that the inner-folding operation or the outer-folding operation is repeated from an unfolding operation. According to an embodiment, the electronic device ED may be provided to selectively carry out any one of the unfolding operation, the inner-folding operation, and the outer-folding operation.

Figure 2:
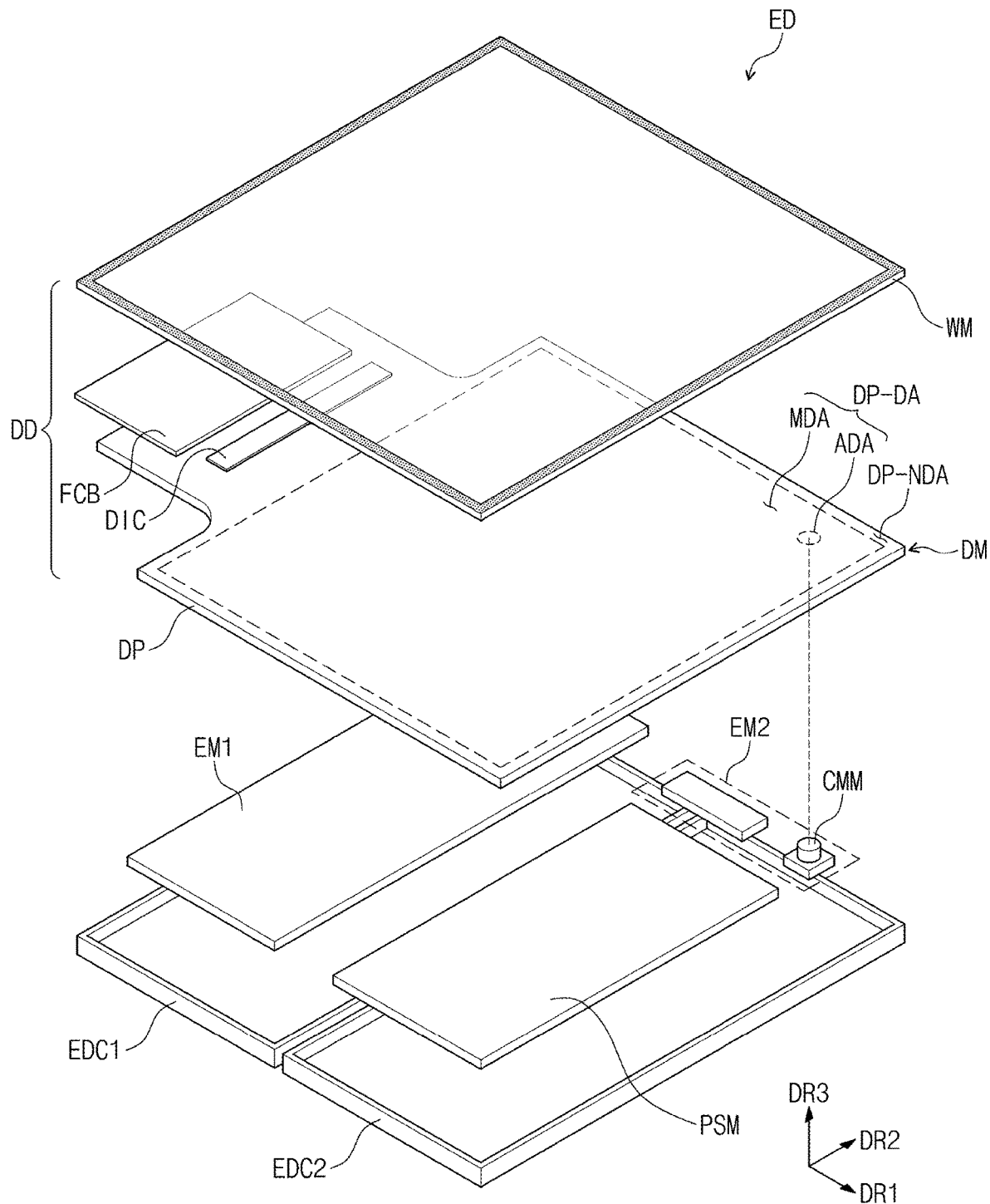
FIG. 2 is an exploded perspective view of the electronic device of FIG. 1A.

FIG. 2 is an exploded perspective view of the electronic device ED according to an embodiment.

Referring to FIG. 2, the electronic device ED may include a display device DD, a first electronic module EM1, a second electronic module EM2, a power supply module PM, and housings EDC1 and EDC2. For example, the electronic device ED may further include a mechanical structure to control a folding operation of the display device DD.

The display device DD may include a window module WM and a display module DM. The window module WM may provide a front surface of the electronic device ED. The display module DM may include at least a display panel DP. The display module DM may generate the image and may sense an external input.

Although the display module DM is shown to be the same as the display panel DP in FIG. 2, however, the display module DM may be a stack structure in which plural components including the display panel DP are stacked one on another.

The display panel DP may include a display area DP-DA and a non-display area DP-NDA, which respectively correspond to the display area DA (refer to FIG. 1A) and the non-display area NDA (refer to FIG. 1A) of the electronic device ED. In the description, the expression "an area/portion corresponds to another area/portion" means that "an area/portion overlaps another area/portion", however, the "areas and portions" should not be limited to have the same size as each other.

The display area DP-DA may include an auxiliary display area ADA and a main display area MDA. The auxiliary display area ADA may overlap or correspond to the sensing area ED-SA (refer to FIG. 1A) of the electronic device ED.

In an embodiment, the auxiliary display area ADA may have a circular shape, however, the shape of the auxiliary display area ADA should not be limited thereto or thereby. The auxiliary display area ADA may have a variety of shapes, such as a polygonal shape, an oval shape, a figure having at least one curved side, or an irregular shape. The auxiliary display area ADA may be referred to as a component area, and the main display area MDA may be referred to as a main display area or a normal display area.

The auxiliary display area ADA may have a transmittance higher than that of the main display area MDA. In addition, the auxiliary display area ADA may have a resolution lower than that of the main display area MDA. The auxiliary display area ADA may overlap a camera module CMM described later.

The display module DM may include a driving chip DIC disposed in the non-display area DP-NDA. The display module DM may further include a flexible circuit film FCB coupled to the non-display area DP-NDA.

The driving chip DIC may include driving elements to drive pixels of the display panel DP, e.g., a data driving circuit. FIG. 2 shows a structure in which the driving chip DIC is mounted on the display panel DP, however, embodiments should not be limited thereto or thereby. As an example, the driving chip DIC may be mounted on the flexible circuit film FCB.

The first electronic module EM1 and the second electronic module EM2 may include a variety of functional modules to drive the electronic device ED. Each of the first electronic module EM1 and the second electronic module EM2 may be mounted directly on a mother board, which is electrically connected to the display panel DP, or may be electrically connected to the mother board via a connector after being mounted on a separate substrate.

The second electronic module EM2 may include the camera module CMM. The camera module CMM may take a photo or video. The camera module CMM may be provided in plural. Among them, some camera modules CMM may overlap the auxiliary display area ADA. The external input, for example, a light, may be provided to the camera module CMM via the auxiliary display area ADA. As an example, the camera module CMM may receive a natural light through the auxiliary display area ADA to take a picture of an external object.

The housings EDC1 and EDC2 may accommodate the display module DM, the first and second electronic modules EM1 and EM2, and the power supply module PM. The housings EDC1 and EDC2 may protect components accommodated therein, e.g., the display module DM, the first and second electronic modules EM1 and EM2, and the power supply module PM. FIG. 2 shows two housings EDC1 and EDC2 separated from each other as a representative example, however, embodiments should not be limited thereto or thereby. For example, the electronic device ED may further include a hinge structure to connect the two housings EDC1 and EDC2. The housings EDC1 and EDC2 may be coupled to the window module WM.

Figure 3:
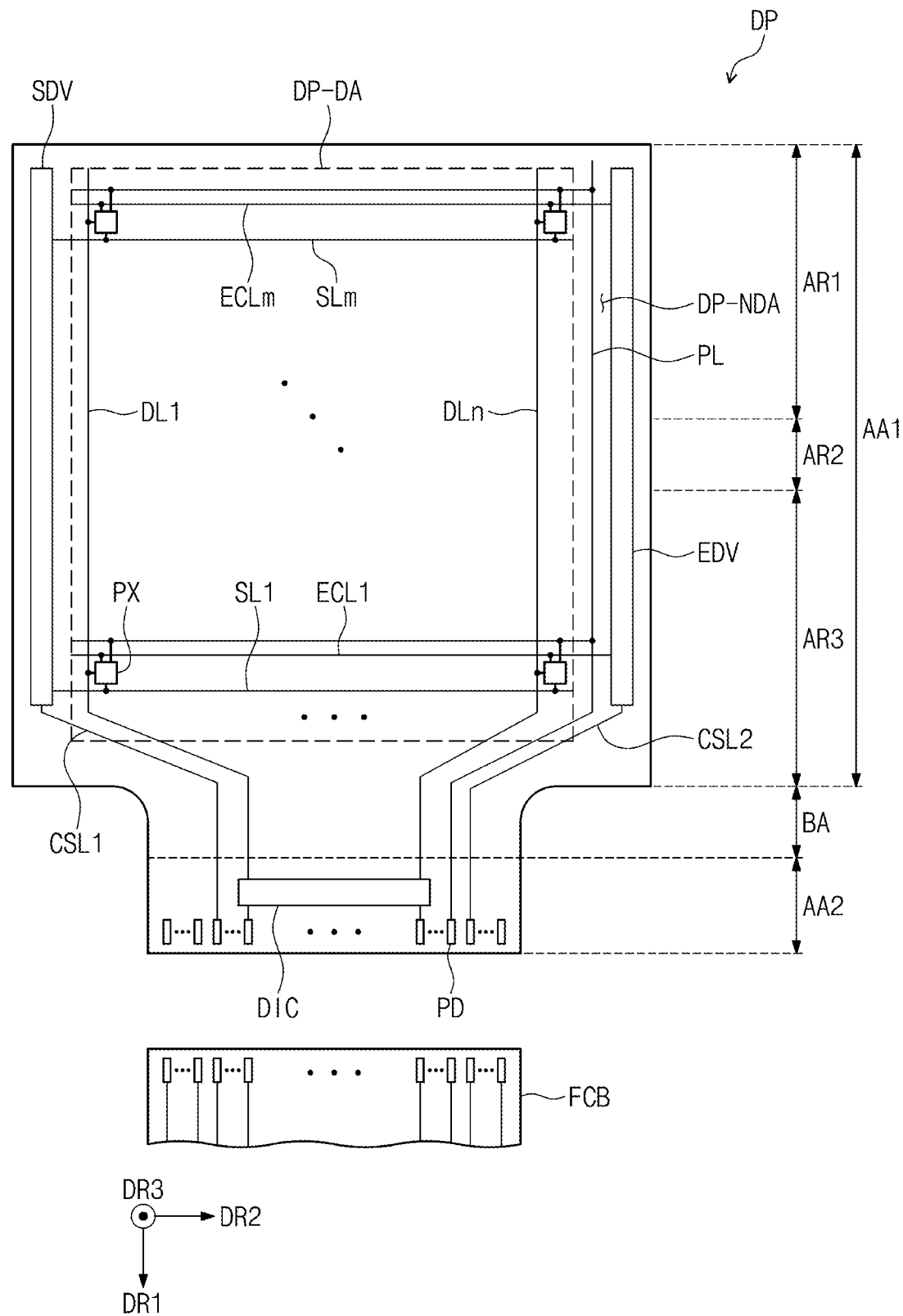
FIG. 3 is a plan view of a display panel of FIG. 2.

FIG. 3 is a plan view of the display panel DP according to an embodiment.

Referring to FIG. 3, the display panel DP may include the display area DP-DA and the non-display area DP-NDA around the display area DP-DA. The display area DP-DA and the non-display area DP-NDA may be distinguished from each other by the presence or absence of a pixel PX. The pixel PX may be disposed in the display area DP-DA. A scan driver SDV, a data driver, and an emission driver EDV may be disposed in the non-display area NDA. The data driver may be a circuit provided in the driving chip DIC.

The display panel DP may include a first panel area AA1, a bending area BA, and a second panel area AA2, which are arranged in the first direction DR1. The second panel area AA2 and the bending area BA may be areas of the non-display area DP-NDA. The bending area BA may be defined between the first panel area AA1 and the second panel area AA2, e.g., in the first direction DR1.

The first panel area AA1 may correspond to the display surface DS of FIG. 1A. The first panel area AA1 may include the first area AR1, the second area AR2, and the third area AR3.

A width (or a length) of the bending area BA in the second direction DR2 and a width (or a length) of the second panel area AA2 in the second direction DR2 may be smaller than a width (or a length) of the first panel area AA1 in the second direction DR2. An area having a relatively short length in a bending axis direction may be relatively easily bent.

The display panel DP may include a plurality of pixels PX, a plurality of scan lines SL1 to SLm, a plurality of data lines DL1 to DLn, a plurality of emission control lines ECL1 to ECLm, first and second control lines CSL1 and CSL2, a driving voltage line PL, and a plurality of pads PD, where each of m and n is a natural number. The pixels PX may be connected to the scan lines SL1 to SLm, the data lines DL1 to DLn, and the emission control lines ECL1 to ECLm.

The scan lines SL1 to SLm may extend in the second direction DR2 and may be electrically connected to the scan driver SDV. The data lines DL1 to DLn may extend in the first direction DR1 and may be electrically connected to the driving chip DIC via the bending area BA. The emission control lines ECL1 to ECLm may extend in the second direction DR2 and may be electrically connected to the emission driver EDV.

The driving voltage line PL may include a portion extending in the first direction DR1 and a portion extending in the second direction DR2. The portion extending in the first direction DR1 and the portion extending in the second direction DR2 may be disposed on different layers from each other. The portion of the driving voltage line PL, which extends in the first direction DR1, may extend to the second panel area AA2 via the bending area BA. The driving voltage line PL may provide a first voltage to the pixels PX.

The first control line CSL1 may be connected to the scan driver SDV and may extend to a lower end of the second panel area AA2 via the bending area BA. The second control line CSL2 may be connected to the emission driver EDV and may extend to the lower end of the second panel area AA2 via the bending area BA.

When viewed in a plane, the pads PD may be disposed adjacent to the lower end of the second panel area AA2. The driving chip DIC, the driving voltage line PL, the first control line CSL1, and the second control line CSL2 may be electrically connected to the pads PD. The flexible circuit film FCB may be electrically connected to the pads PD through an anisotropic conductive adhesive layer.

Figure 4:
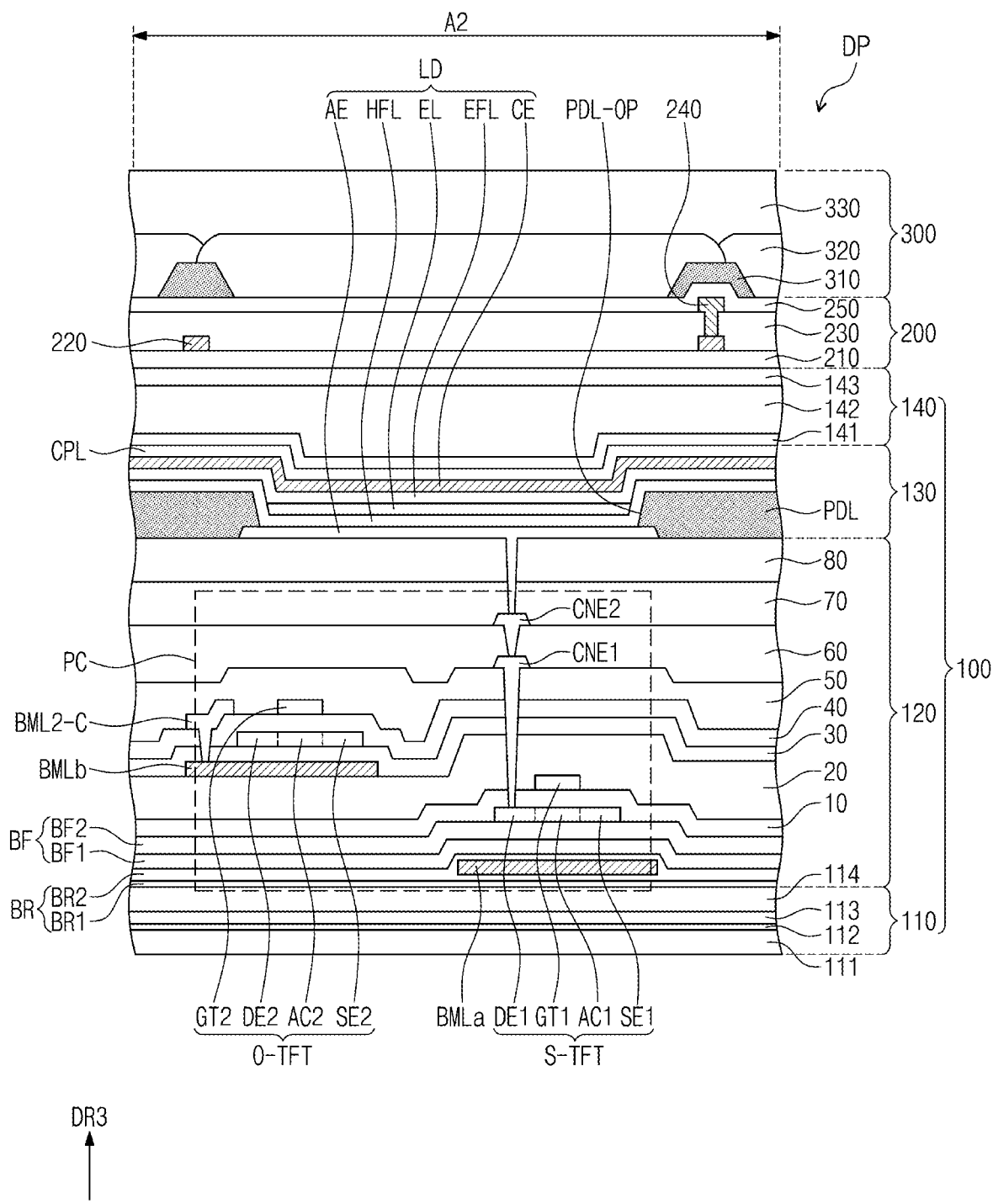
FIG. 4 is a cross-sectional view of a main display area of the display panel of FIG. 3.

FIG. 4 is a cross-sectional view of the main display area MDA of the display panel DP according to an embodiment.

Referring to FIG. 4, the display panel DP may include a display layer 100, a sensor layer 200, and an anti-reflective layer 300.

The display layer 100 may have a configuration that generates the image. The display layer 100 may be a light emitting type display layer. For example, the display layer 100 may be an organic light emitting display layer, an inorganic light emitting display layer, an organic-inorganic light emitting display layer, a quantum dot display layer, a micro-LED display layer, or a nano-LED display layer. The display layer 100 may include a substrate 110, a circuit layer 120, a light emitting element layer 130, and an encapsulation layer 140.

The substrate 110 may include a plurality of layers 111, 112, 113, and 114. As an example, the substrate 110 may include a first sub-base layer 111, a first intermediate barrier layer 112, a second intermediate barrier layer 113, and a second sub-base layer 114. The first sub-base layer 111, the first intermediate barrier layer 112, the second intermediate barrier layer 113, and the second sub-base layer 114 may be sequentially stacked in the third direction DR3.

Each of the first sub-base layer 111 and the second sub-base layer 114 may include at least one of a polyimide-based resin, an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. In the description, the term "A-based resin" means that a functional group of "A" is included.

A barrier layer BR may be disposed on the substrate 110. The barrier layer BR may include a first sub-barrier layer BR1 disposed on the substrate 110 and a second sub-barrier layer BR2 disposed on the first sub-barrier layer BR1.

Each of the first and second intermediate barrier layers 112 and 113 and each of the first and second sub-barrier layers BR1 and BR2 may include an inorganic material. Each of the first and second intermediate barrier layers 112 and 113 and each of the first and second sub-barrier layers BR1 and BR2 may include at least one of silicon oxide, silicon nitride, silicon oxynitride, and amorphous silicon.

A buffer layer BF may be disposed on the barrier layer BR. The buffer layer BF may prevent metal atoms or impurities from being diffused to a first semiconductor pattern from the substrate 110. In addition, the buffer layer BF may control a rate of heat supply during a crystallization process to form the first semiconductor pattern so that the first semiconductor pattern may be uniformly formed.

The buffer layer BF may include a first sub-buffer layer BF1 and a second sub-buffer layer BF2 disposed on the first sub-buffer layer BF1. Each of the first sub-buffer layer BF1 and the second sub-buffer layer BF2 may include at least one of silicon oxide, silicon nitride, and silicon oxynitride. As an example, the first sub-buffer layer BF1 may include silicon nitride, and the second sub-buffer layer BF2 may include silicon oxide.

A first light blocking layer BMLa may be disposed under a silicon thin film transistor S-TFT, and a second light blocking layer BMLb may be disposed under an oxide thin film transistor O-TFT. Each of the first light blocking layer BMLa and the second light blocking layer BMLb may be disposed to overlap a pixel circuit PC to protect the pixel circuit PC. The first light blocking layer BMLa and the second light blocking layer BMLb may not be disposed in the auxiliary display area ADA.

The first and second light blocking layers BMLa and BMLb may prevent an electric potential caused by a polarization phenomenon of the first sub-base layer 111 or the second sub-base layer 114 from exerting influence on the pixel circuit PC. According to an embodiment, the second light blocking layer BMLb may be omitted.

The first light blocking layer BMLa may be disposed in the second sub-barrier layer BR2. As an example, a lower portion of the second sub-barrier layer BR2 in a thickness direction is formed, and then the first light blocking layer BMLa is formed on the lower portion of the second sub-barrier layer BR2. Then, an upper portion of the second sub-barrier layer BR2 in the thickness direction may be formed to cover the first light blocking layer BMLa.

The second light blocking layer BMLb may be disposed between a second insulating layer 20 and a third insulating layer 30. The second light blocking layer BMLb may be connected to a contact electrode BML2-C to receive a constant voltage or a signal. The contact electrode BML2-C may be disposed on the same layer as a layer on which a gate GT2 of the oxide thin film transistor O-TFT is disposed.

The first semiconductor pattern may be disposed on the buffer layer BF. The first semiconductor pattern may include a silicon semiconductor. As an example, the silicon semiconductor may include amorphous silicon or polycrystalline silicon. For example, the first semiconductor pattern may include low temperature polycrystalline silicon.

FIG. 4 shows only a portion of the first semiconductor pattern disposed on the buffer layer BF, and the first semiconductor pattern may be further disposed in other areas. The first semiconductor pattern may be arranged according to a specific rule over the pixels. The first semiconductor pattern may have different electrical properties according to whether it is doped or not or whether it is doped with an N-type dopant or a P-type dopant. The first semiconductor pattern may include a first region having a relatively high conductivity and a second region having a relatively low conductivity. The first region may be doped with the N-type dopant or the P-type dopant. A P-type transistor may include a doped region doped with the P-type dopant, and an N-type transistor may include a doped region doped with the N-type dopant. The second region may be a non-doped region or a region doped at a concentration lower than that of the first region.

The first region may have a conductivity greater than that of the second region and may be substantially used as an electrode or a signal line. The second region may substantially correspond to an active area (e.g., a channel) of the transistor. In other words, a portion of the first semiconductor pattern may be the active area of the transistor, another portion of the first semiconductor pattern may be a source area or a drain area of the transistor, and the other portion of the first semiconductor pattern may be a connection electrode or a connection signal line.

A source area SE1, an active area AC1, and a drain area DE1 of the silicon thin film transistor S-TFT may be formed from the first semiconductor pattern. The source area SE1 and the drain area DE1 may extend in opposite directions to each other from the active area AC1 in a cross-section.

A first insulating layer 10 may be disposed on the buffer layer BF. The first insulating layer 10 may commonly overlap the pixels and may cover the first semiconductor pattern. The first insulating layer 10 may be an inorganic layer and/or an organic layer and may have a single-layer or multi-layer structure. The first insulating layer 10 may include at least one of aluminum oxide ($Al_2O_3$), titanium oxide ($Ta_2O_5$), silicon oxide ($SiO_2$), silicon nitride ($SiN_x$), silicon oxynitride ($SiO_xN_y$), zirconium oxide ($ZrO_2$), and hafnium oxide ($HfO_2$). In an embodiment, the first insulating layer 10 may have a single-layer structure of a silicon oxide layer. Not only the first insulating layer 10, but also an insulating layer of the circuit layer 120 described later may be an inorganic layer and/or an organic layer and may have a single-layer or multi-layer structure. The inorganic layer may include at least one of the above-mentioned materials, however, embodiments should not be limited thereto or thereby.

A gate GT1 of the silicon thin film transistor S-TFT may be disposed on the first insulating layer 10. The gate GT1 may be a portion of a metal pattern. The gate GT1 may overlap the active area AC1. The gate GT1 may be used as a mask in a process of doping the first semiconductor pattern. The gate GT1 may include titanium (Ti), silver (Ag), an alloy including silver (Ag), molybdenum (Mo), an alloy including molybdenum (Mo), aluminum (Al), an alloy including aluminum (Al), aluminum nitride (AlN), tungsten (W), tungsten nitride (WN), copper (Cu), indium tin oxide (ITO), indium zinc oxide (IZO), or the like, however, embodiments should not be particularly limited thereto.

The second insulating layer 20 may be disposed on the first insulating layer 10 and may cover the gate GT1. The second insulating layer 20 may be an inorganic layer and may have a single-layer or multi-layer structure. The second insulating layer 20 may include at least one of silicon oxide, silicon nitride, and silicon oxynitride. According to an embodiment, the second insulating layer 20 may have the multi-layer structure of a silicon oxide layer and a silicon nitride layer.

The third insulating layer 30 may be disposed on the second insulating layer 20. The third insulating layer 30 may have a single-layer or multi-layer structure. As an example, the third insulating layer 30 may have the multi-layer structure of a silicon oxide layer and a silicon nitride layer.

A second semiconductor pattern may be disposed on the third insulating layer 30. The second semiconductor pattern may include an oxide semiconductor. The oxide semiconductor may include a plurality of areas distinguished from each other according to whether a metal oxide is reduced. The area (hereinafter, referred to as a reduced area) in which the metal oxide is reduced has a conductivity greater than that of the area (hereinafter, referred to as a non-reduced area) in which the metal oxide is not reduced. The reduced area may act as the source/drain areas of the transistor or the signal line. The non-reduced area may substantially correspond to the active area (e.g., a semiconductor area, or a channel) of the transistor. In other words, a portion of the second semiconductor pattern may be the active area of the transistor, another portion of the second semiconductor pattern may be the source/drain areas of the transistor, and the other portion of the second semiconductor pattern may be a signal transmission area.

A source area SE2, an active area AC2, and a drain area DE2 of the oxide thin film transistor O-TFT may be formed from the second semiconductor pattern. The source area SE2 and the drain area DE2 may extend in opposite directions to each other from the active area AC2 in a cross-section.

A fourth insulating layer 40 may be disposed on the third insulating layer 30. The fourth insulating layer 40 may commonly overlap the pixels and may cover the second semiconductor pattern. The fourth insulating layer 40 may include at least one of aluminum oxide ($Al_2O_3$), titanium oxide ($Ta_2O_5$), silicon oxide ($SiO_2$), silicon nitride ($SiN_x$), silicon oxynitride ($SiO_xN_y$), zirconium oxide ($ZrO_2$), and hafnium oxide ($HfO_2$).

The gate GT2 of the oxide thin film transistor O-TFT may be disposed on the fourth insulating layer 40. The gate GT2 may be a portion of a metal pattern. The gate GT2 may overlap the active area AC2. The gate GT2 may be used as a mask in a process of doping the second semiconductor pattern.

A fifth insulating layer 50 may be disposed on the fourth insulating layer 40 and may cover the gate GT2. The fifth insulating layer 50 may be an inorganic layer and/or an organic layer and may have a single-layer or multi-layer structure.

A first connection electrode CNE1 may be disposed on the fifth insulating layer 50. The first connection electrode CNE1 may be connected to the drain area DE1 of the silicon thin film transistor S-TFT via a contact hole defined through the first to fifth insulating layers 10 to 50.

A sixth insulating layer 60 may be disposed on the fifth insulating layer 50. The sixth insulating layer 60 may include an organic material. For example, the sixth insulating layer 60 may include a polyimide-based resin. A second connection electrode CNE2 may be disposed on the sixth insulating layer 60. The second connection electrode CNE2 may be connected to the first connection electrode CNE1 through a contact hole defined through the sixth insulating layer 60.

The seventh insulating layer 70 may be disposed on the sixth insulating layer 60 and may cover the second connection electrode CNE2. An eighth insulating layer 80 may be disposed on the seventh insulating layer 70.

Each of the sixth insulating layer 60, the seventh insulating layer 70, and the eighth insulating layer 80 may be an organic layer. As an example, each of the sixth insulating layer 60, the seventh insulating layer 70, and the eighth insulating layer 80 may include a general-purpose polymer, such as benzocyclobutene (BCB), polyimide, hexamethyldisiloxane (HMDSO), polymethylmethacrylate (PMMA), or polystyrene (PS), a polymer derivative having a phenolic group, an acrylic-based polymer, an imide-based polymer, an aryl ether-based polymer, an amide-based polymer, and a fluorine-based polymer, a p-xylene-based polymer, a vinyl alcohol-based polymer, or blends thereof.

The light emitting element layer 130 including a light emitting elements LD may be disposed on the circuit layer 120. The light emitting elements LD may include a pixel electrode AE, a first functional layer HFL, a light emitting layer EL, a second functional layer EFL, and a common electrode CE. The first functional layer HFL, the second functional layer EFL, and the common electrode CE may be commonly provided over the pixels PX (refer to FIG. 3).

The pixel electrode AE may be disposed on the eighth insulating layer 80. The pixel electrode AE may be a semi-transmissive electrode, a transmissive electrode, or a reflective electrode. According to an embodiment, the pixel electrode AE may include a reflective layer formed of Ag, Mg, Al, Pt, Pd, Au, Ni, Nd, Ir, Cr, or compounds thereof and a transparent or semi-transparent electrode layer formed on the reflective layer. The transparent or semi-transparent electrode layer may include at least one selected from the group consisting of indium tin oxide (ITO), indium zinc oxide (IZO), indium gallium zinc oxide (IGZO), zinc oxide (ZnO), indium oxide (In2O3), and aluminum-doped zinc oxide (AZO). For instance, the pixel electrode AE may have a stack structure of ITO/Ag/ITO.

A pixel definition layer PDL may be disposed on the eighth insulating layer 80. The pixel definition layer PDL may have a light absorbing property. For example, the pixel definition layer PDL may have a black color. The pixel definition layer PDL may include a black coloring agent. The black coloring agent may include a black dye or a black pigment. The black coloring agent may include a metal material, such as carbon black, chromium, or an oxide thereof.

The pixel definition layer PDL may be provided with an opening PDL-OP defined therethrough to expose a portion of the pixel electrode AE. For example, the pixel definition layer PDL may cover an edge of the pixel electrode AE.

The first functional layer HFL may be disposed on the pixel electrode AE and the pixel definition layer PDL. The first functional layer HFL may include a hole transport layer, may include a hole injection layer, or may include both the hole transport layer and the hole injection layer. The first functional layer HFL may be disposed over the auxiliary display area ADA (refer to FIG. 2) and the main display area MDA (refer to FIG. 2).

The light emitting layer EL may be disposed on the first functional layer HFL and may be disposed in an area corresponding to the opening PDL-OP of the pixel definition layer PDL. The light emitting layer EL may include an organic material, an inorganic material, or an organic-inorganic material which emits a light having a predetermined color. The light emitting layer EL may be disposed in the auxiliary display area ADA and the main display area MDA.

The second functional layer EFL may be disposed on the first functional layer HFL and may cover the light emitting layer EL. The second functional layer EFL may include an electron transport layer, may include an electron injection layer, or may include both the electron transport layer and the electron injection layer. The second functional layer EFL may be disposed over the auxiliary display area ADA and the main display area MDA.

The common electrode CE may be disposed on the second functional layer EFL. The common electrode CE may be disposed in the auxiliary display area ADA and the main display area MDA.

The light emitting element layer 130 may further include a capping layer CPL disposed on the common electrode CE. The capping layer CPL may include LiF, an inorganic material, and/or an organic material.

The encapsulation layer 140 may be disposed on the light emitting element layer 130. The encapsulation layer 140 may include an inorganic layer 141, an organic layer 142, and an inorganic layer 143, which are sequentially stacked, however, layers included in the encapsulation layer 140 should not be limited thereto or thereby.

The inorganic layers 141 and 143 may protect the light emitting element layer 130 from moisture and oxygen, and the organic layer 142 may protect the light emitting element layer 130 from a foreign substance such as dust particles. The inorganic layers 141 and 143 may include a silicon nitride layer, a silicon oxynitride layer, a silicon oxide layer, a titanium oxide layer, or an aluminum oxide layer. The organic layer 142 may include an acrylic-based organic layer, however, embodiments should not be limited thereto or thereby.

The sensor layer 200 may sense an external input applied thereto from the outside. The external input may be a user input. The user input may include a variety of external inputs, such as a part of user's body, light, heat, pen, or pressure.

The sensor layer 200 may be disposed on the display layer 100. The sensor layer 200 may be referred to as a sensor, an input sensing layer, or an input sensing panel. The sensor layer 200 may include a sensor base layer 210, a first sensor conductive layer 220, a sensor insulating layer 230, a second sensor conductive layer 240, and a sensor cover layer 250.

The sensor base layer 210 may be disposed directly on the display layer 100. The sensor base layer 210 may be an inorganic layer including at least one of silicon nitride, silicon oxynitride, and silicon oxide. According to an embodiment, the sensor base layer 210 may be an organic layer including an epoxy resin, an acrylic resin, or an imide-based resin. The sensor base layer 210 may have a single-layer structure or a multi-layer structure of layers stacked in the third direction DR3.

Each of the first sensor conductive layers 220 and the second sensor conductive layer 240 may have a single-layer structure or a multi-layer structure of layers stacked in the third direction DR3.

The conductive layer having the single-layer structure may include a metal layer or a transparent conductive layer. The metal layer may include molybdenum, silver, titanium, copper, aluminum, or alloys thereof. The transparent conductive layer may include a transparent conductive oxide, such as indium tin oxide (ITO), indium zinc oxide (IZO), zinc oxide (ZnO), indium zinc tin oxide (ITZO), or the like. In addition, the transparent conductive layer may include conductive polymer such as PEDOT, metal nanowire, graphene, or the like.

The conductive layer having the multi-layer structure may include metal layers. The metal layers may have a three-layer structure of titanium/aluminum/titanium. The conductive layer having the multi-layer structure may include at least one metal layer and at least one transparent conductive layer.

The sensor insulating layer 230 may be disposed between the first sensor conductive layer 220 and the second sensor conductive layer 240. The sensor insulating layer 230 may include an inorganic layer. The inorganic layer may include at least one of aluminum oxide ($Al_2O_3$), titanium oxide ($Ta_2O_5$), silicon oxide ($SiO_2$), silicon nitride ($SiN_x$), silicon oxynitride ($SiO_xN_y$), zirconium oxide ($ZrO_2$), and hafnium oxide ($HfO_2$).

According to an embodiment, the sensor insulating layer 230 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

The sensor cover layer 250 may be disposed on the sensor insulating layer 230 and may cover the second sensor conductive layer 240. The sensor cover layer 250 may include an inorganic material. As an example, the sensor cover layer 250 may include silicon nitride, however, embodiments should not be limited thereto or thereby.

The anti-reflective layer 300 may be disposed on the sensor layer 200. The anti-reflective layer 300 may include a division layer 310, a plurality of color filters 320, and a planarization layer 330.

The division layer 310 may be disposed to overlap the second sensor conductive layer 240. The sensor cover layer 250 may be disposed between the division layer 310 and the second sensor conductive layer 240. The division layer 310 may prevent an external light from being reflected by the second sensor conductive layer 240. Materials for the division layer 310 should not be particularly limited as long as the materials absorb a light. The division layer 310 may have a black color and may have a black coloring agent. The black coloring agent may include a black dye or a black pigment. The black coloring agent may include a metal material, such as carbon black, chromium, or an oxide thereof.

The planarization layer 330 may cover the division layer 310 and the color filters 320. The planarization layer 330 may include an organic material and may provide a flat surface on an upper surface thereof. According to an embodiment, the planarization layer 330 may be omitted.

Figure 5:
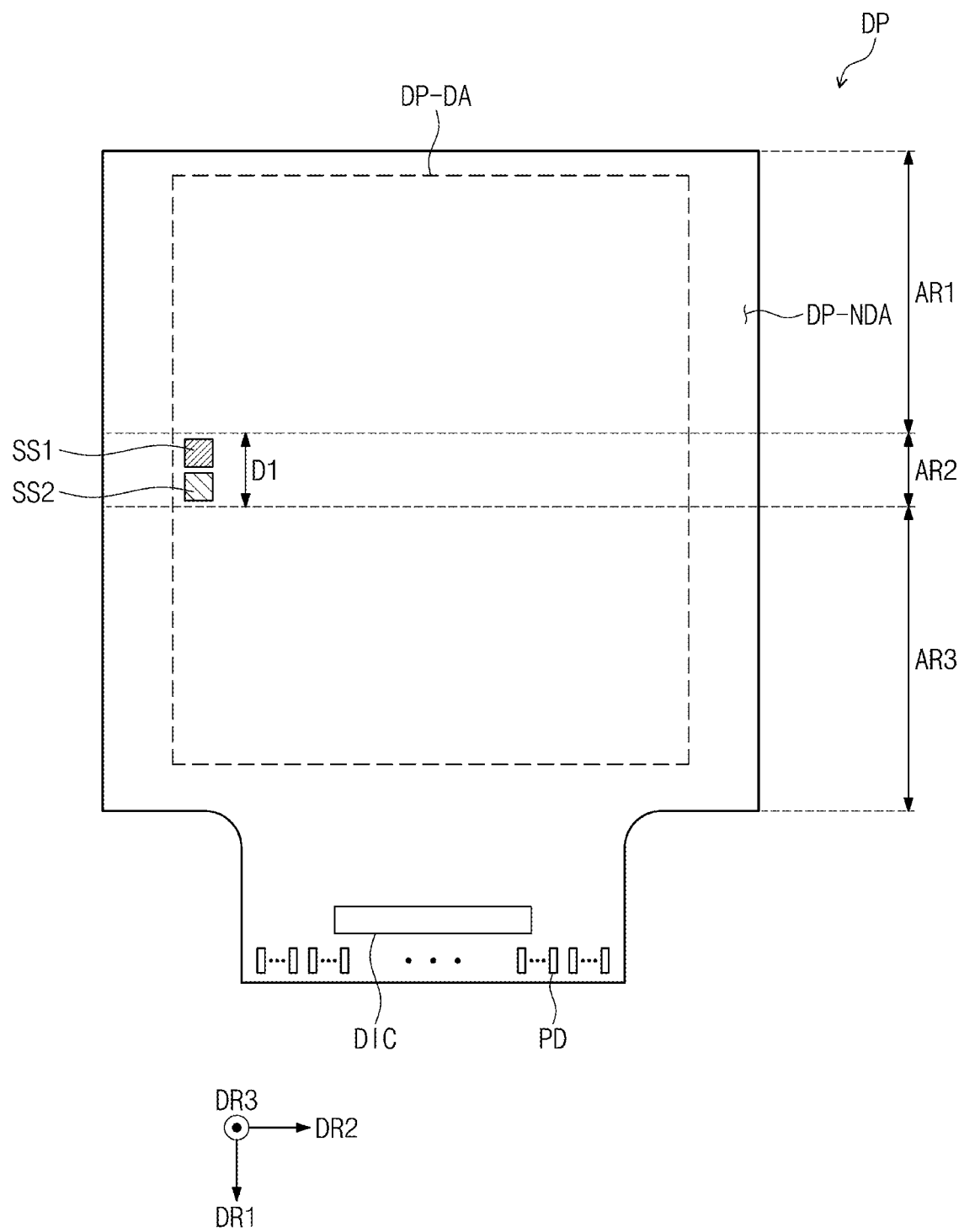
FIG. 5 is a plan view of an embodiment of the display panel of FIG. 2.

FIG. 5 is a plan view of the display panel DP according to an embodiment.

Referring to FIGS. 4 and 5, a length D1 of the second area AR2 in the first direction DR1 may be defined as a folding portion length D1. The folding portion length D1 may be changed according to a size of the electronic device ED (refer to FIG. 1A). As an example, in a case where the electronic device ED is a foldable mobile phone, the folding portion length D1 may be about 7500 micrometers, and in a case where the electronic device ED is a tablet PC, the folding portion length D1 may be about 15000 micrometers. However, the length D1 in the first direction DR1 described above is merely one example, and embodiments should not be limited thereto or thereby. As the size of the electronic device ED increases, the folding portion length D1 may increase, and thus, more sensors SS1 and SS2 may be required. Hereinafter, a structure in which a plurality of sensors SS1 and SS2 is disposed in the electronic device ED (refer to FIG. 1A) will be described.

The display panel DP may include a first sensor SS1 and a second sensor SS2. The first sensor SS1 and the second sensor SS2 may be disposed spaced spart from each other in the first direction DR1. Each of the first sensor SS1 and the second sensor SS2 may be disposed in the second area AR2 and in the display area DP-DA.

As the first and second sensors SS1 and SS2 are disposed spaced apart from each other along the first direction DR1 in the second area AR2, a location of cracks occurring in the second area AR2 may be precisely determined. Further, a folding angle of the display panel DP may be sensed by the first and second sensors SS1 and SS2, and the operation of the display panel DP may be controlled based on the folding angle.

As an example, when the cracks occur in the second area AR2 adjacent to the first area AR1, a resistance measured by the first sensor SS1 may be greater than a resistance measured by the second sensor SS2. When the cracks occur in the second area AR2 adjacent to the third area AR3, the resistance measured by the second sensor SS2 may be greater than the resistance measured by the first sensor SS1. FIG. 5 shows two sensors, e.g., the first and second sensors SS1 and SS2, as a representative example, however, the number of the sensors included in the display panel DP should not be particularly limited thereto.

The circuit layer 120 may include a plurality of insulating layers, a plurality of conductive layers, and at least one semiconductor layer. In addition, the sensor layer 200 may include the first sensor conductive layer 220 and the second sensor conductive layer 240. The insulating layers may include the first, second, third, fourth, fifth, sixth, seventh, and eighth insulating layers 10, 20, 30, 40, 50, 60, 70, and 80. The conductive layers may include a first conductive layer including the first light blocking layer BMLa, a second conductive layer including the gate GT1 of the silicon thin film transistor S-TFT, a third conductive layer including the second light blocking layer BMLb, a fourth conductive layer including the gate GT2 of the oxide thin film transistor O-TFT, a fifth conductive layer including the first connection electrode CNE1, and a sixth conductive layer including the second connection electrode CNE2. The at least one semiconductor layer may include a first semiconductor layer including the source area SE1, the active area AC1, and the drain area DE1 of the silicon thin film transistor S-TFT and a second semiconductor layer including the source area SE2, the active area AC2, and the drain area DE2 of the oxide thin film transistor O-TFT.

The first sensor SS1 and the second sensor SS2 may be disposed on layers different from each other. As an example, one among the conductive layers, the at least one semiconductor layer, and the sensor conductive layers corresponds to a first layer. For example, the first layer may include a first sensor SS1. As an example, another one among the conductive layers, the at least one semiconductor layer, and the sensor conductive layers corresponds to a second layer, which is different from the first layer. For example, the second layer may include a second sensor SS2. As the first sensor SS1 and the second sensor SS2 are disposed on different layers from each other, the resistance measured by the first sensor SS1 may be different from the resistance measured by the second sensor SS2 when the display panel DP is folded at a predetermined angle. Accordingly, a reliability with respect to a folding degree of the display panel DP, which is measured by the first sensor SS1 and the second sensor SS2, may be improved. In addition, as the first sensor SS1 and the second sensor SS2 are disposed on different layers from each other, it is possible to determine a degree of stress occurring in different layers from each other in detail.

A portion of the display area DP-DA of the display panel DP may be defined as a keyboard area. A keyboard image may be displayed in the keyboard area. The second sensor SS2 may be disposed in the keyboard area of the display panel DP or may be disposed adjacent to the keyboard area. The number of occurrences of a touch event and a pressure generation is higher in the keyboard area than in the other area of the display area DP-DA. Accordingly, the second sensor SS2 may have a rigidity greater than that of the first sensor SS1.

Figure 6:
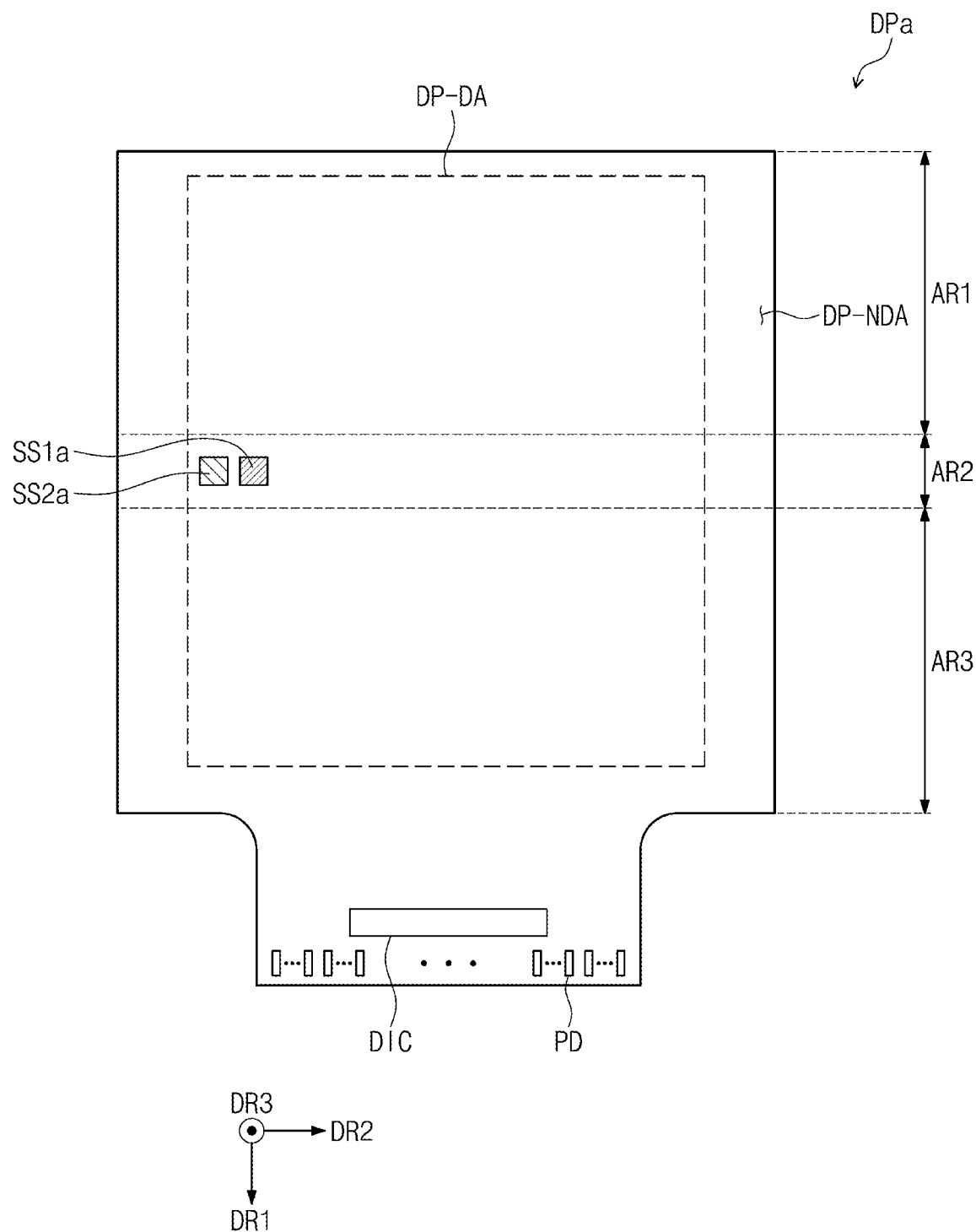
FIG. 6 is a plan view of another embodiment of the display panel of FIG. 2.

FIG. 6 is a plan view of a display panel DPa according to an embodiment.

Referring to FIG. 6, the display panel DPa may include a first sensor SS1a and a second sensor SS2a. The first sensor SS1a and the second sensor SS2a may be disposed on layers different from each other. As the first sensor SS1a and the second sensor SS2a are disposed on different layers from each other, it is possible to determine or sense a degree of stress occurring in different layers from each other in detail. In addition, a reliability with respect to a folding degree of the display panel DPa, which is measured by the first sensor SS1a and the second sensor SS2a, may be improved.

The first sensor SS1a and the second sensor SS2a may be disposed spaced apart from each other in the second direction DR2. Each of the first sensor SS1a and the second sensor SS2a may be disposed in the second area AR2 and in the display area DP-DA. As the first and second sensors SS1a and SS2a are disposed spaced apart from each other in the second direction DR2 in the second area AR2, a location of cracks occurring in the second area AR2 may be precisely determined. Further, the folding angle of the display panel DPa may be sensed by the first and second sensors SS1a and SS2a, and the operation of the display panel DPa may be controlled based on the folding angle.

As an example, when the cracks occur in the second area AR2 adjacent to a center of the display panel DPa, a resistance measured by the first sensor SS1a may be greater than a resistance measured by the second sensor SS2a. When the cracks occur in the second area AR2 adjacent to an edge of the display panel DPa, the resistance measured by the second sensor SS2a may be greater than the resistance measured by the first sensor SS1a. FIG. 6 shows two sensors, e.g., the first and second sensors SS1a and SS2a, as a representative example, however, the number of the sensors included in the display panel DPa should not be particularly limited thereto.

Figure 7:
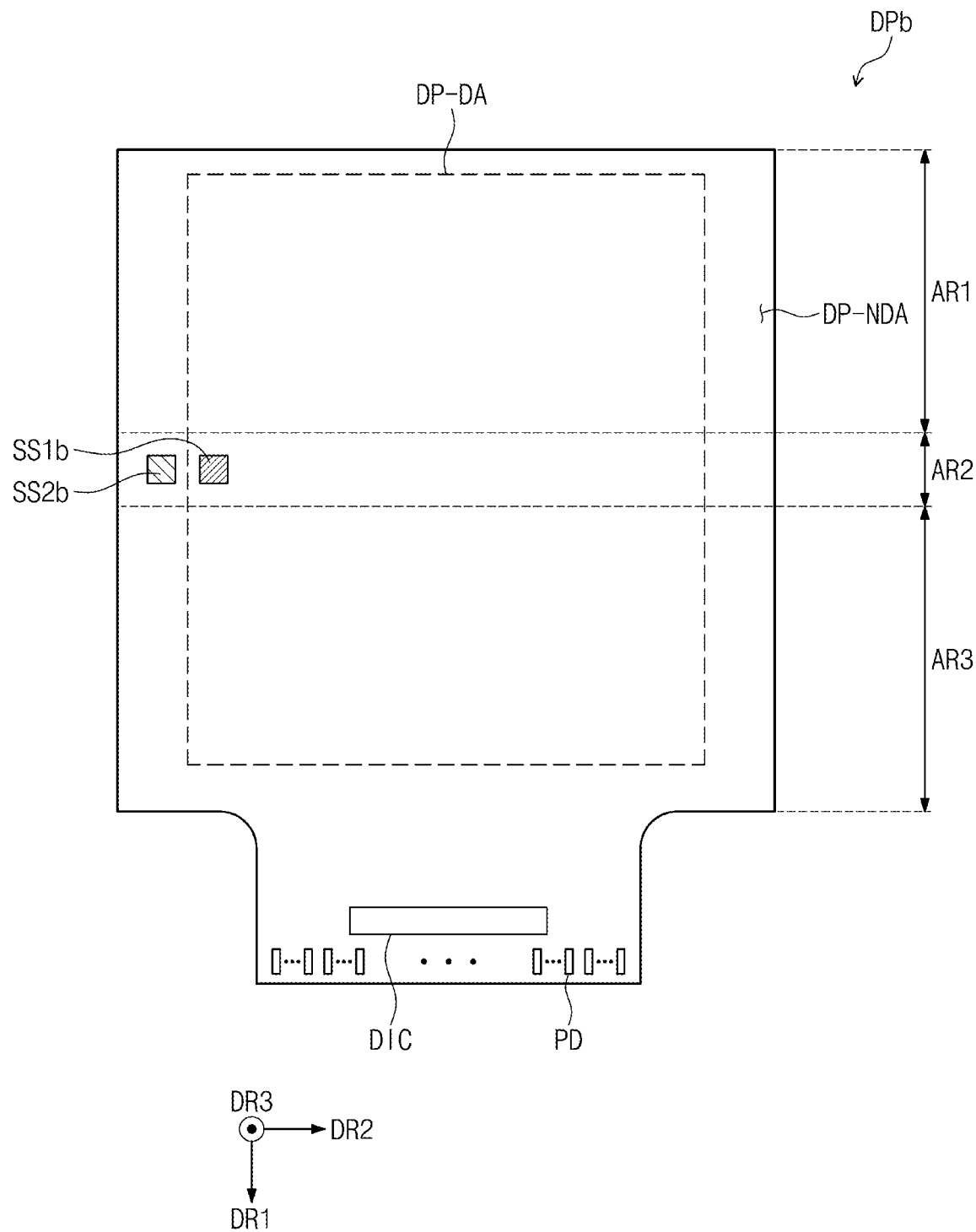
FIG. 7 is a plan view of another embodiment of the display panel of FIG. 2.

FIG. 7 is a plan view of a display panel DPb according to an embodiment.

Referring to FIG. 7, the display panel DPb may include a first sensor SS1b and a second sensor SS2b. The first sensor SS1b and the second sensor SS2b may be disposed on layers different from each other. As the first sensor SS1b and the second sensor SS2b are disposed on different layers from each other, it is possible to determine or sense a degree of stress occurring in different layers from each other in detail. In addition, a reliability with respect to a folding degree of the display panel DPb, which is measured by the first sensor SS1b and the second sensor SS2b, may be improved.

The first sensor SS1b and the second sensor SS2b may be disposed spaced apart from each other in the second direction DR2. The first sensor SS1b may be disposed in the second area AR2 and in the display area DP-DA, and the second sensor SS2b may be disposed in the second area AR2 and in the non-display area DP-NDA. As the first and second sensors SS1b and SS2b are disposed spaced apart from each other in the second direction DR2 in the second area AR2, a location of cracks occurring in the second area AR2 may be precisely determined or sensed. As an example, the first sensor SS1b may sense the cracks in the display area DP-DA, and the second sensor SS2b may sense the cracks in the non-display area DP-NDA. Further, the folding angle of the display panel DPb may be sensed by the first and second sensors SS1b and SS2b, and the operation of the display panel DPb may be controlled based on the folding angle.

FIG. 7 shows two sensors SS1b and SS2b as a representative example, however, the number of the sensors included in the display panel DPb should not be particularly limited thereto. As an example, the number of the sensors disposed in the display area DP-DA or the non-display area DP-NDA may be one, or may be three or more.

Figure 8A:
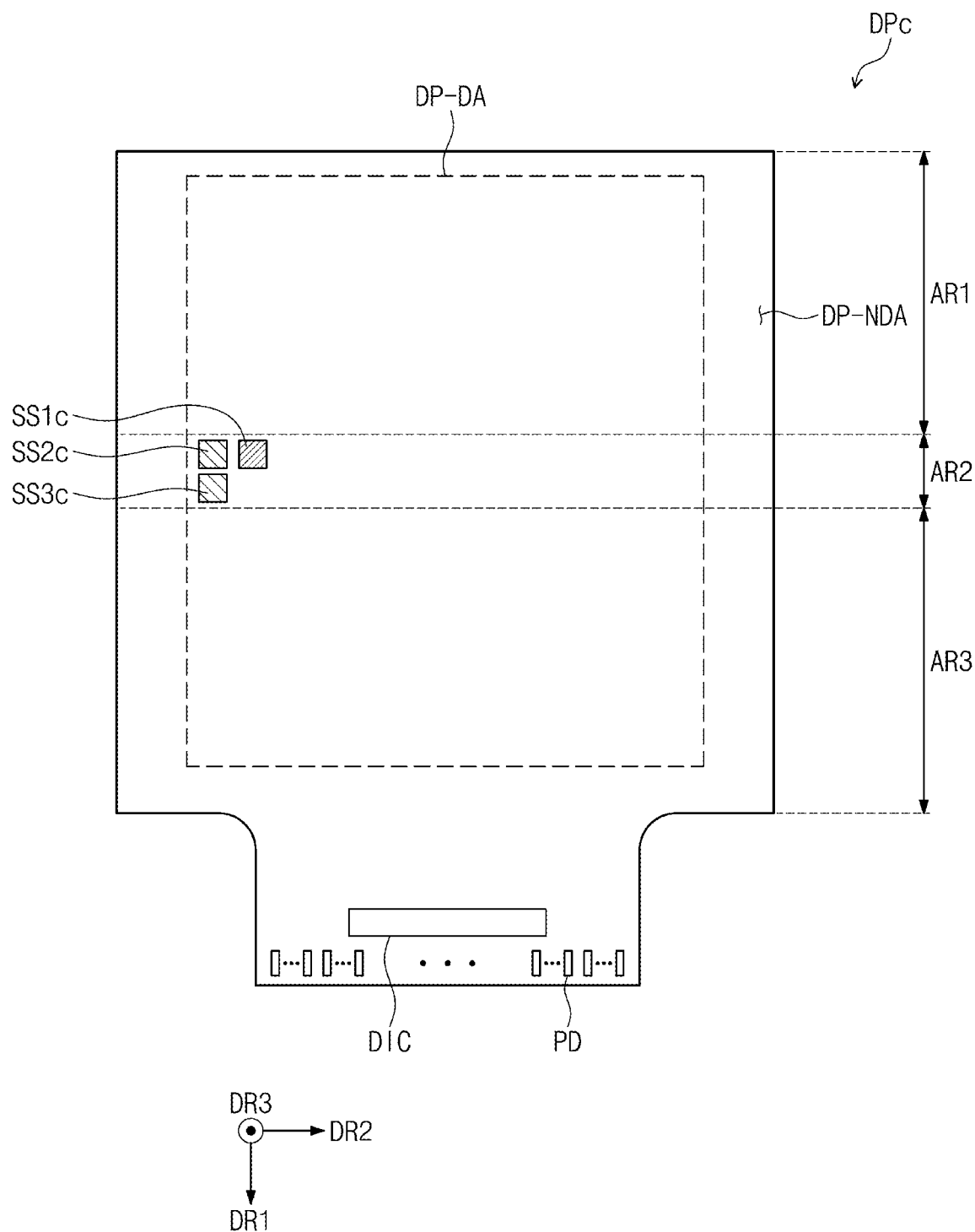
FIG. 8A is a plan view of another embodiment of the display panel of FIG. 2.
Figure 8B:
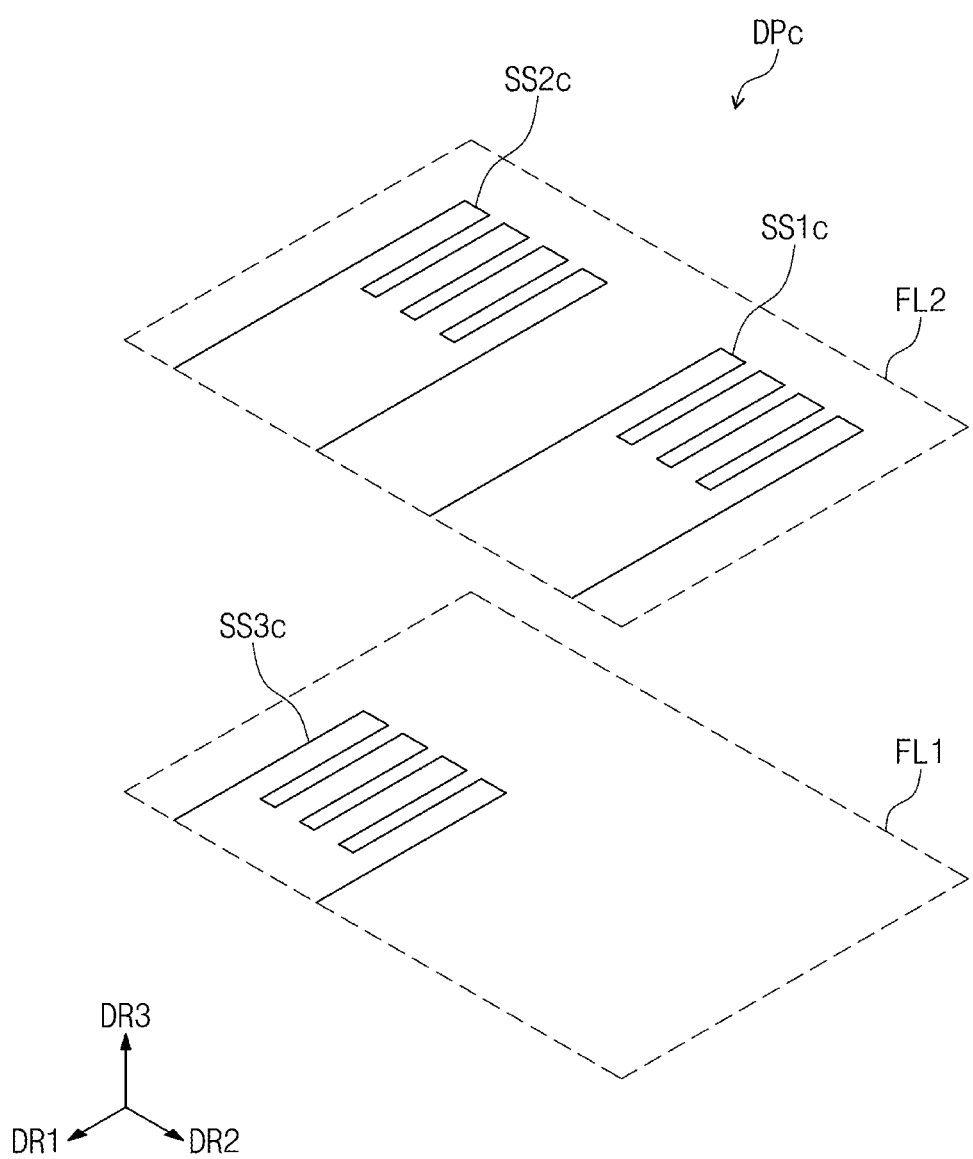
FIG. 8B is a perspective view of a first sensor, a second sensor, and a third sensor shown in FIG. 8A.

FIG. 8A is a plan view of a display panel DPc according to an embodiment, and FIG. 8B is a perspective view of a first sensor SS1c, a second sensor SS2c, and a third sensor SS3c shown in FIG. 8A.

Referring to FIG. 8A, the display panel DPc may include the first sensor SS1c, the second sensor SS2c, and the third sensor SS3c. At least one of the first sensor SS1c, the second sensor SS2c, and the third sensor SS3c may be disposed on a layer different from a layer on which at least one the of the other sensors is disposed. As at least one of the first sensor SS1c, the second sensor SS2c, and the third sensor SS3c is disposed on the layer different from the layer on which at least one of the other sensors is disposed, it is possible to determine or sense a degree of stress occurring in different layers from each other in detail. In addition, a reliability with respect to a folding degree of the display panel DPc, which is measured by the first sensor SS1c, the second sensor SS2c, and the third sensor SS3c, may be improved.

When viewed in a plane, the first sensor SS1c and the second sensor SS2c may be disposed spaced apart from each other in the second direction DR2, and the second sensor SS2c and the third sensor SS3c may be disposed spaced apart from each other in the first direction DR1. Each of the first sensor SS1c, the second sensor SS2c, and the third sensor SS3c may be disposed in the second area AR2 and in the display area DP-DA. As the first sensor SS1c and the second sensor SS2c are disposed spaced apart from each other in the second area AR2 along the second direction DR2, a location of cracks occurring in the second area AR2 may be precisely determined. In addition, as the second sensor SS2c and the third sensor SS3c are disposed spaced apart from each other in the second area AR2 along the first direction DR1, the location of cracks occurring in the second area AR2 may be precisely determined or sensed. Further, as the sensors SS1c, SS2c and SS3c are disposed in various directions, the folding angle may be sensed more accurately, and the location and size of the cracks may be more precisely sensed.

Referring to FIGS. 4 and 8B, a first layer FL1 may include the third sensor SS3c, and a second layer FL2 may include the first sensor SS1c and the second sensor SS2c. The first layer FL1 and the second layer FL2 may be disposed spaced apart from each other in the third direction DR3. For example, the first, second, and third sensors SS1c, SS2c, and SS3c may be used to precisely measure and sense a degree of stress occurring in different layers from each other and a location of cracks occurring in the second area AR2. For example, the first, second, and third sensors SS1c, SS2c, and SS3c may include deformation sensors, strain gauge sensors, crack sensors, and angle detection sensors.

The first layer FL1 may be one among the first conductive layer including the first light blocking layer BMLa, the second conductive layer including the gate GT1 of the silicon thin film transistor S-TFT, the third conductive layer including the second light blocking layer BMLb, the fourth conductive layer including the gate GT2 of the oxide thin film transistor O-TFT, the fifth conductive layer including the first connection electrode CNE1, the sixth conductive layer including the second connection electrode CNE2, the first semiconductor layer including the source area SE1, the active area AC1, and the drain area DE1 of the silicon thin film transistor S-TFT, the second semiconductor layer including the source area SE2, the active area AC2, and the drain area DE2 of the oxide thin film transistor O-TFT, the first sensor conductive layer 220, and the second sensor conductive layer 240.

The second layer FL2 may be another layer among the first conductive layer including the first light blocking layer BMLa, the second conductive layer including the gate GT1 of the silicon thin film transistor S-TFT, the third conductive layer including the second light blocking layer BMLb, the fourth conductive layer including the gate GT2 of the oxide thin film transistor O-TFT, the fifth conductive layer including the first connection electrode CNE1, the sixth conductive layer including the second connection electrode CNE2, the first semiconductor layer including the source area SE1, the active area AC1, and the drain area DE1 of the silicon thin film transistor S-TFT, the second semiconductor layer including the source area SE2, the active area AC2, and the drain area DE2 of the oxide thin film transistor O-TFT, the first sensor conductive layer 220, and the second sensor conductive layer 240.

Referring to FIG. 8B, When the display panel DPc is inwardly folded (e.g., inner-folding state), the third sensor SS3c disposed on the first layer FL1 may be more deformed than the first and second sensors SS1c and SS2c disposed on the second layer FL2. Accordingly, the third sensor SS3c may be more flexible than the first and second sensors SS1c and SS2c. When the display panel DPc is outwardly folded (e.g., outer-folding state), the first and second sensors SS1c and SS2c disposed on the second layer FL2 may be more deformed than the third sensor SS3c disposed on the first layer FL1. Accordingly, the first and second sensors SS1c and SS2c may be more flexible than the third sensor SS3c, however, this is merely one example, and embodiments should not be limited thereto or thereby.

FIG. 8B shows a structure in which the first sensor SS1c and the second sensor SS2c are disposed on the same layer and the third sensor SS3c is disposed on a layer different from the layer on which the first sensor SS1c and the second sensor SS2c are disposed, however, embodiments should not be particularly limited thereto. As an example, the first sensor SS1c and the third sensor SS3c may be disposed on the same layer, and the second sensor SS2c may be disposed on a layer different from the layer on which the first sensor SS1c and the third sensor SS3c are disposed.

Figure 9:
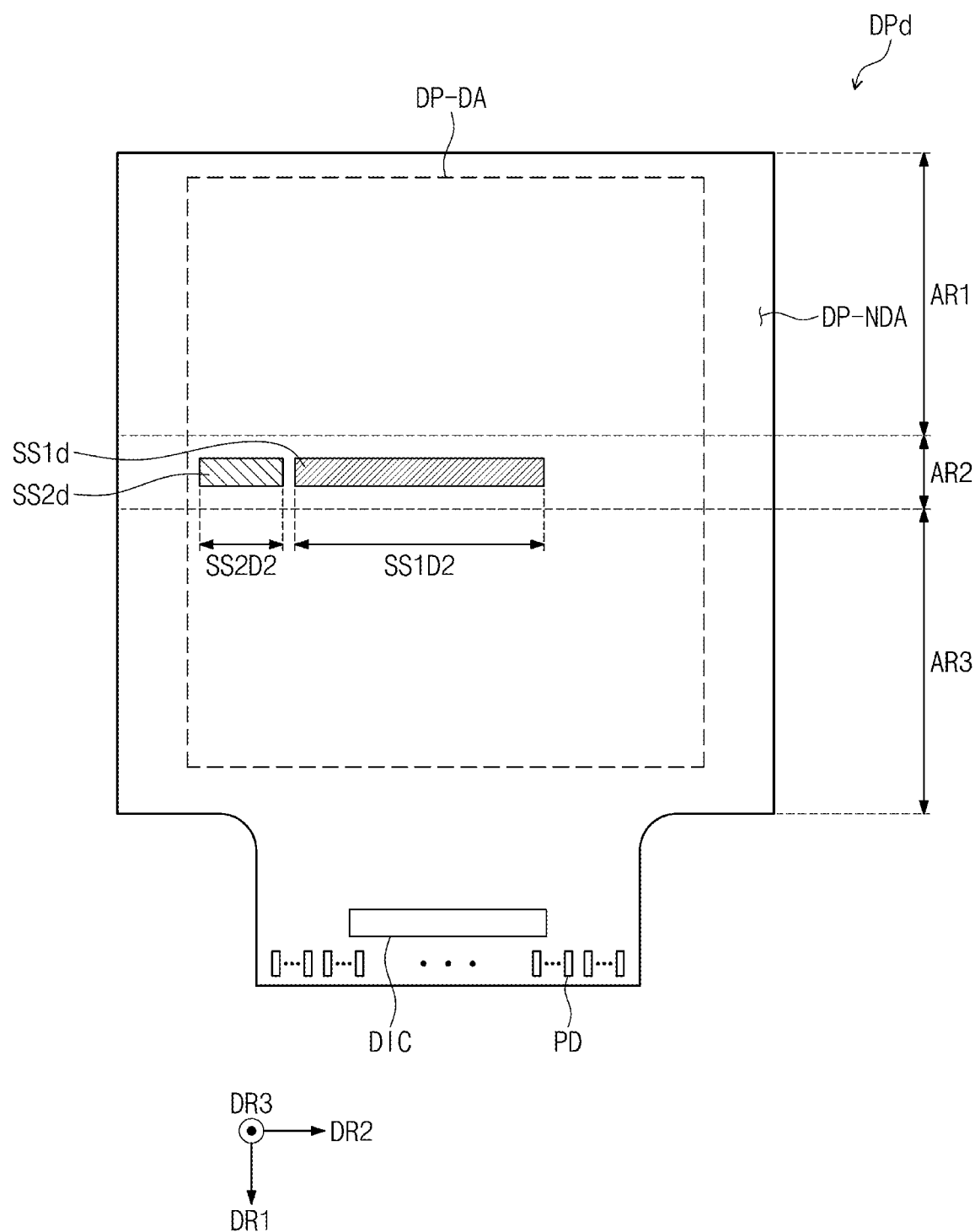
FIG. 9 is a plan view of another embodiment of the display panel of FIG. 2.

FIG. 9 is a plan view of a display panel DPd according to an embodiment.

Referring to FIG. 9, the display panel DPd may include a first sensor SS1d and a second sensor SS2d. Each of the first sensor SS1d and the second sensor SS2d may be disposed in the second area AR2 and in the display area DP-DA. The first sensor SS1d and the second sensor SS2d may be disposed on layers different from each other. As the first sensor SS1d and the second sensor SS2d are disposed on different layers from each other, it is possible to determine or sense a degree of stress occurring in different layers from each other in detail. In addition, a reliability with respect to a folding degree of the display panel DPd, which is measured by the first sensor SS1d and the second sensor SS2d, may be improved.

FIG. 9 shows a structure in which the first sensor SS1d and the second sensor SS2d are arranged in the second direction DR2 as a representative example, however, embodiments should not be particularly limited thereto. As an example, the first sensor SS1d and the second sensor SS2d may be arranged in the first direction DR1.

A length SS1D2 of the first sensor SS1d in the second direction DR2 may be greater than a length SS2D2 of the second sensor SS2d in the second direction DR2. FIG. 9 shows a structure in which the length SS1D2 in the second direction DR2 of the first sensor SS1d disposed at a center of the display area DP-DA is greater than the length SS2D2 in the second direction DR2 of the second sensor SS2d disposed at an end of the display area DP-DA, however, embodiments should not be particularly limited thereto. As an example, the length SS2D2 of the second sensor SS2d in the second direction DR2 may be greater than the length SS1D2 of the first sensor SS1d in the second direction DR2.

Figure 10:
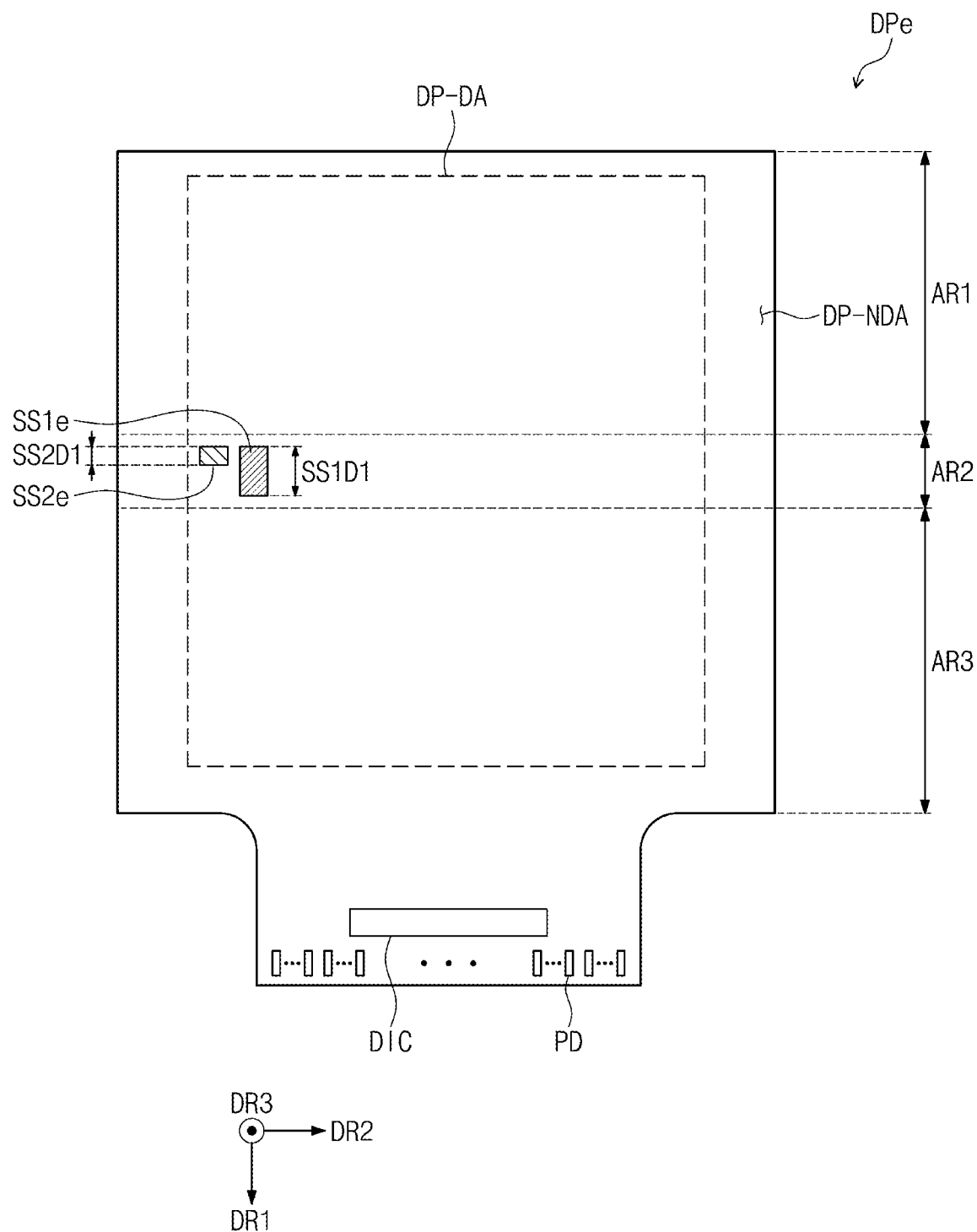
FIG. 10 is a plan view of another embodiment of the display panel of FIG. 2.

FIG. 10 is a plan view of a display panel DPe according to an embodiment.

Referring to FIG. 10, the display panel DPe may include a first sensor SS1e and a second sensor SS2e. Each of the first sensor SS1e and the second sensor SS2e may be disposed in the second area AR2 and in the display area DP-DA. The first sensor SS1e and the second sensor SS2e may be disposed on layers different from each other. As the first sensor SS1e and the second sensor SS2e are disposed on different layers from each other, it is possible to determine or sense a degree of stress occurring in different layers from each other in detail. In addition, a reliability with respect to a folding degree of the display panel DPe, which is measured by the first sensor SS1e and the second sensor SS2e, may be improved.

FIG. 10 shows a structure in which the first sensor SS1e and the second sensor SS2e are arranged in the second direction DR2 as a representative example, however, embodiments should not be particularly limited thereto. As an example, the first sensor SS1e and the second sensor SS2e may be arranged in the first direction DR1.

A length SS1D1 in the first direction DR1 of the first sensor SS1e may be greater than a length SS2D1 in the first direction DR1 of the second sensor SS2e. FIG. 10 shows a structure in which the length SS1D1 in the first direction DR1 of the first sensor SS1e is greater than the length SS2D1 in the first direction DR1 of the second sensor SS2e, however, embodiments should not be particularly limited thereto. As an example, the length SS2D1 in the first direction DR1 of the second sensor SS2e may be greater than the length SS1D1 in the first direction DR1 of the first sensor SS1e.

Figure 11:
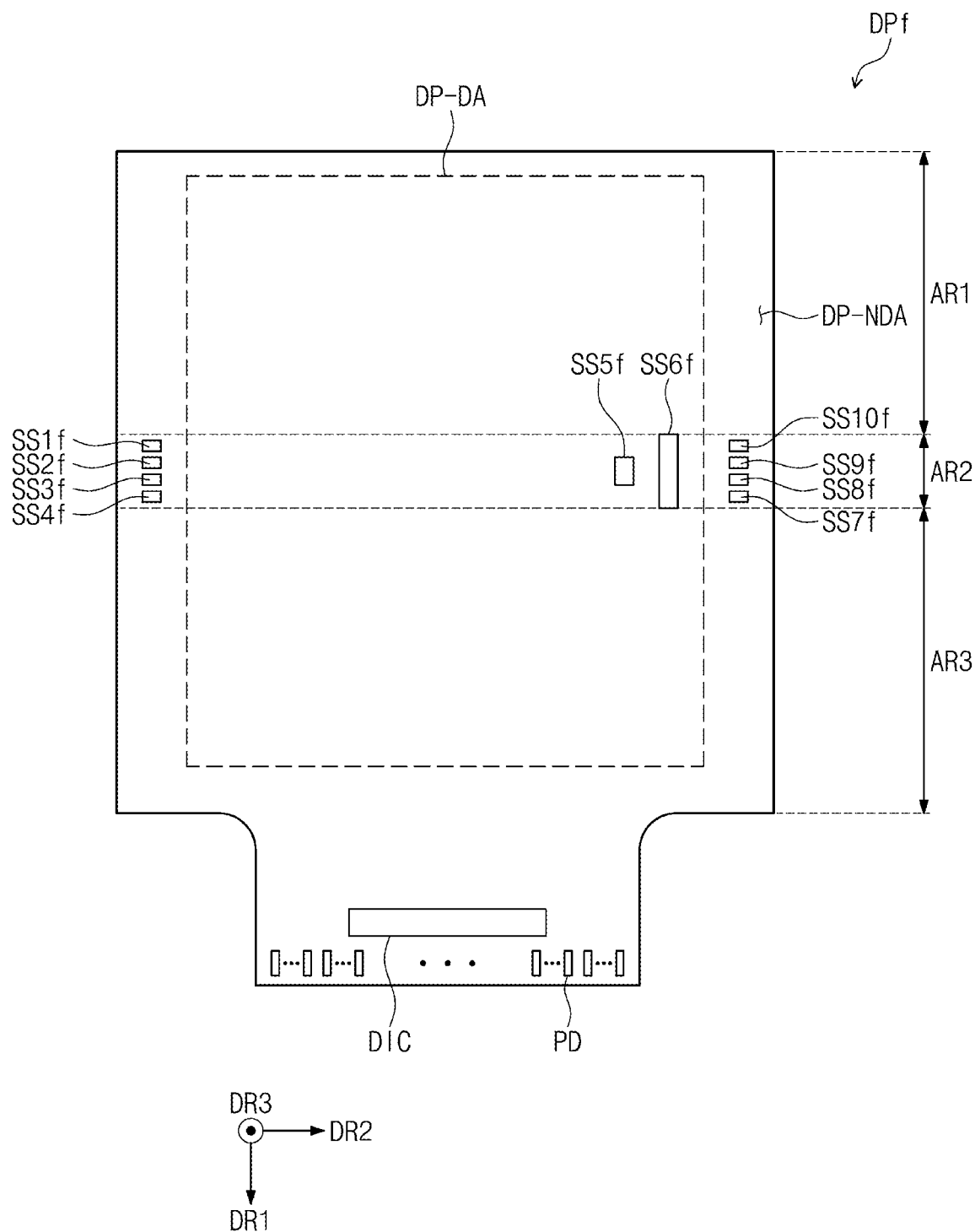
FIG. 11 is a plan view of another embodiment of the display panel of FIG. 2.

FIG. 11 is a plan view of a display panel DPf according to an embodiment.

Referring to FIG. 11, the display panel DPf may include a first sensor SS1f, a second sensor SS2f, a third sensor SS3f, a fourth sensor SS4f, a fifth sensor SS5f, a sixth sensor SS6f, a seventh sensor SS7f, an eighth sensor SS8f, a ninth sensor SS9f, and a tenth sensor SS10f. Among the first, second, third, fourth, fifth, sixth, seventh, eighth, ninth, and tenth sensors SS1f, SS2f, SS3f, SS4f, SS5f, SS6f, SS7f, SS8f, SS9f, and SS10f, at least one sensor may be disposed on a layer different from a layer on which at least one of the other sensors among the first to tenth sensors SS if to SS10f is disposed. As the at least one sensor among the first, second, third, fourth, fifth, sixth, seventh, eighth, ninth, and tenth sensors SS1f, SS2f, SS3f, 554f, SS5f, 556f, 557f, 558f, 559f, and SS10f is disposed on the layer different from the layer on which at least one of the other sensors is disposed, it is possible to determine or sense a degree of stress occurring in different layers from each other in detail. In addition, a reliability with respect to a folding degree of the display panel DPf, which is measured by the first to tenth sensors SS1f to SS10f, may be improved.

The first, second, third, and fourth sensors SS1f, S52f, S53f, and SS4f may be disposed spaced apart from the fifth sensor SS5f and the sixth sensor SS6f in the second direction, and the fifth sensor SS5f and the sixth sensor SS6f may be disposed spaced apart from the seventh, eighth, ninth, and tenth sensors S57f, S58f, S59f, and SS10f in the second direction DR2. The first, second, third, and fourth sensors SS1f, S52f, S53f, and SS4f may be disposed spaced apart from each other in the first direction DR1, the seventh, eighth, ninth, and tenth sensors S57f, S58f, S59f, and SS10f may be disposed spaced apart from each other in the first direction DR1. Each of the first, second, third, and fourth sensors SS1f, S52f, S53f, and SS4f and the seventh, eighth, ninth, and tenth sensors S57f, S58f, S59f, and SS10f may be disposed in the second area AR2 and in the non-display area DP-NDA. Each of the fifth sensor SS5f and the sixth sensor SS6f may be disposed in the second area AR2 and in the display area DP-PA.

Lengths of the sensors SS1f, S52f, S53f, S54f, SS5f, S56f, S57f, S58f, S59f, and SS10f in the first and second directions DR1 and DR2 may vary. As an example, the length of the sixth sensor SS6f in the first direction DR1 may be greater than the length of the fifth sensor SS5f in the first direction DR1. In addition, areas of the sensors SS1f, SS2f, SS3f, SS4f, SS5f, SS6f, SS7f, SS8f, SS9f, and SS10f may vary. As an example, the area of the sixth sensor SS6f may be greater than the area of the fifth sensor SS5f.

The sensors SS1f, SS2f, SS3f, SS4f, SS5f, SS6f, SS7f, SS8f, SS9f, and SS10f may have different elasticities or different rigidities according to positional characteristics and bending characteristics thereof.

As the sensors SS1f, SS2f, SS3f, SS4f, SS5f, SS6f, SS7f, SS8f, SS9f, and SS10f are disposed spaced apart from each other in the first direction DR1 or the second direction DR2 in the second area AR2 and the lengths of the sensors SS1f, SS2f, SS3f, SS4f, SS5f, SS6f, SS7f, SS8f, SS9f, and SS10f in the first and second directions DR1 and DR2 may vary, a location of cracks occurring in the second area AR2 may be precisely determined. FIG. 11 shows ten sensors as a representative example, however, the number of the sensors included in the display panel DPf should not be limited to ten.

According to an embodiment, as the sensors SS1f, SS2f, SS3f, SS4f, SS5f, SS6f, SS7f, SS8f, SS9f, and SS10f are arranged at various locations, locations of defects or damages may be determined or measured in detail. Accordingly, the structure of the display panel DPf may be reinforced by using information on specific locations where defects occur due to the repeated folding and unfolding operations of the display panel DPf.

Figure 12:
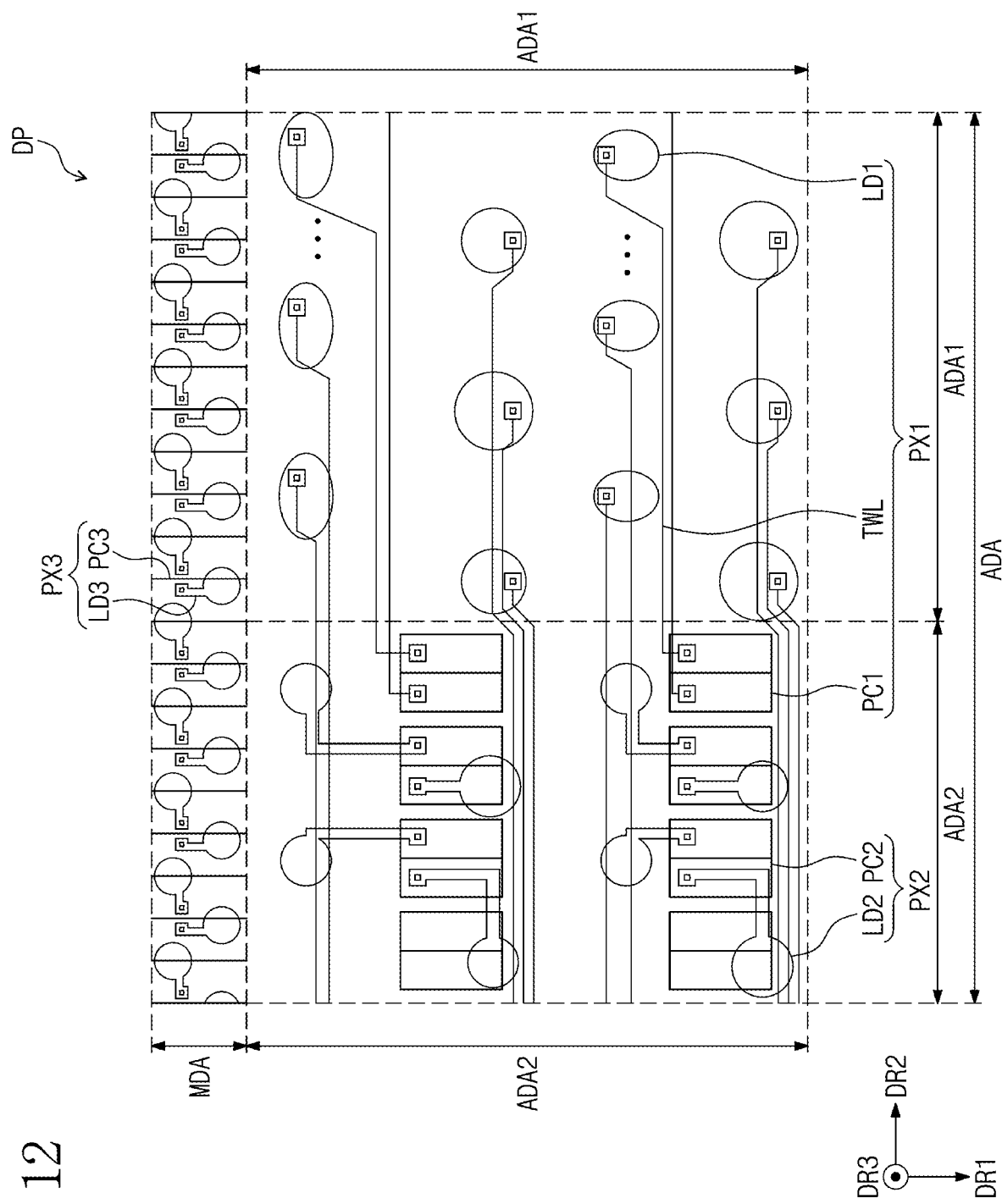
FIG. 12 is an enlarged plan view of a portion of the display panel of FIG. 2.

FIG. 12 is an enlarged plan view of a portion of the display panel DP according to an embodiment.

Referring to FIG. 12, the display area DP-DA (refer to FIG. 3) may include the auxiliary display area ADA and the main display area MDA. The auxiliary display area ADA may include a first auxiliary display area ADA1 and a second auxiliary display area ADA2. The first auxiliary display area ADA1 may be referred to as a component area, and the second auxiliary display area ADA2 may be referred to as an intermediate area or a transition area, and the main display area MDA may be referred to as a general display area. The display panel DP may include a plurality of pixels PX. The pixels PX may include a first pixel PX1 for emitting a light in the first auxiliary display area ADA1, a second pixel PX2 for emitting a light in the second auxiliary display area ADA2, and a third pixel PX3 for emitting a light in the main display area MDA.

Each of the first pixel PX1, the second pixel PX2, and the third pixel PX3 may be provided in plural. In this case, each of the first, second, and third pixels PX1, PX2, and PX3 may include a red pixel, a green pixel, and a blue pixel and may further include a white pixel according to an embodiment.

The first pixel PX1 may include a first light emitting element LD1 and a first pixel circuit PC1 to drive the first light emitting element LD1. The second pixel PX2 may include a second light emitting element LD2 and a second pixel circuit PC2 to drive the second light emitting element LD2, and the third pixel PX3 may include a third light emitting element LD3 and a third pixel circuit PC3 to drive the third light emitting element LD3.

The first auxiliary display area ADA1 may overlap or correspond to the sensing area ED-SA shown in FIG. 1A. For example, the first auxiliary display area ADA1 may be provided in an area overlapping the camera module CMM (refer to FIG. 2) when viewed in a plane. As an example, an external input, e.g., a light, may be provided to the camera module CMM via the first auxiliary display area ADA1, and an output from the camera module CMM may exit to the outside via the first auxiliary display area ADA1. In an embodiment, the first auxiliary display area ADA1 is shown as a circular shape, however, the shape of the first auxiliary display area ADA1 should not be limited thereto or thereby. According to an embodiment, the first auxiliary display area ADA1 may have a variety of shapes, such as a polygonal shape, an oval shape, a figure having at least one curved side, or an irregular shape.

The number of pixels provided in the first auxiliary display area ADA1 may be smaller than that provided in the main display area MDA to secure a size of a transmission area. An area in which the first light emitting element LD1 is not disposed in the first auxiliary display area ADA1 may be defined as the transmission area TA (refer to FIG. 8). As an example, an area in the first auxiliary display area ADA1 where a first pixel electrode of the first light emitting element LD1 and a pixel definition pattern surrounding the first pixel electrode are not disposed may be defined as the transmission area.

The number of the first pixels PX1 disposed in the first auxiliary display area ADA1 per a unit area or the same area may be smaller than the number of the third pixels PX3 disposed in the main display area MDA per the unit area or the same area. As an example, a resolution of the first auxiliary display area ADA1 may be about ½, ⅜, ⅓, ¼, ⅖, ⅛, ⅑, or ¹⁄₁₆ of a resolution of the main display area MDA. As an example, the resolution of the main display area MDA may be equal to or greater than about 400 ppi, and the resolution of the first auxiliary display area ADA1 may be about 200 ppi or about 100 ppi. However, this is merely one example and should not be particularly limited thereto.

The first pixel circuit PC1 of the first pixel PX1 may not be disposed in the first auxiliary display area ADA1. As an example, the first pixel circuit PC1 may be disposed in the second auxiliary display area ADA2 or the non-display area DP-NDA (refer to FIG. 3). In this case, a light transmittance of the first auxiliary display area ADA1 may increase compared with the case when the first pixel circuit PC1 is disposed in the first auxiliary display area ADA1.

The first light emitting element LD1 may be electrically connected to the first pixel circuit PC1 via a connection line TWL. The connection line TWL may overlap the transmission area of the first auxiliary display area ADA1. The connection line TWL may include a transparent conductive line. The transparent conductive line may include a transparent conductive material or a light transmissive material. As an example, the connection line TWL may include a transparent conductive oxide (TCO), such as indium tin oxide (ITO), indium zinc oxide (IZO), indium gallium zinc oxide (IGZO), zinc oxide (ZnO), indium oxide ($In_2O_3$), or the like.

The second auxiliary display area ADA2 may be defined adjacent to the first auxiliary display area ADA1. The second auxiliary display area ADA2 may surround at least a portion of the first auxiliary display area ADA1. The second auxiliary display area ADA2 may have a transmittance lower than that of the first auxiliary display area ADA1. In an embodiment, the second auxiliary display area ADA2 may be spaced apart from the non-display area DP-NDA (refer to FIG. 3), however, embodiments should not be limited thereto or thereby. According to an embodiment, the second auxiliary display area ADA2 may be in contact with the non-display area DP-NDA.

The first pixel circuit PC1 of the first pixel PX1, the second light emitting element LD2, and the second pixel circuit PC2 may be disposed in the second auxiliary display area ADA2. Accordingly, the light transmittance of the second auxiliary display area ADA2 may be lower than the light transmittance of the first auxiliary display area ADA1. In addition, as the first pixel circuit PC1 of the first pixel PX1 is disposed in the second auxiliary display area ADA2, the number of the second pixels PX2 disposed in the second auxiliary display area ADA2 per the unit area or the same area may be smaller than the number of the third pixels PX3 disposed in the main display area MDA per the unit area or the same area. The resolution of the image displayed in the second auxiliary display area ADA2 may be lower than the resolution of the image displayed in the main display area MDA.

The main display area MDA may be adjacent to the second auxiliary display area ADA2. The main display area MDA may have a transmittance lower than a transmittance of the first auxiliary display area ADA1. The third light emitting element LD3 and the third pixel circuit PC3 may be disposed in the main display area MDA.

Each of the first light emitting element LD1, the second light emitting element LD2, and the third light emitting element LD3 may be provided in plural. A distance between two first light emitting elements nearest to each other among the first light emitting elements LD1 may be greater than a distance between two third light emitting elements nearest to each other among the third light emitting elements LD3. In addition, a distance between two second light emitting elements nearest to each other among the second light emitting elements LD2 may be greater than the distance between the two third light emitting elements nearest to each other among the third light emitting elements LD3.

The first light emitting element LD1 shown in FIG. 12 may correspond to a shape of a first pixel electrode AE1 (refer to FIG. 13) of the first light emitting element LD1 when viewed in a plane.

Figure 13:
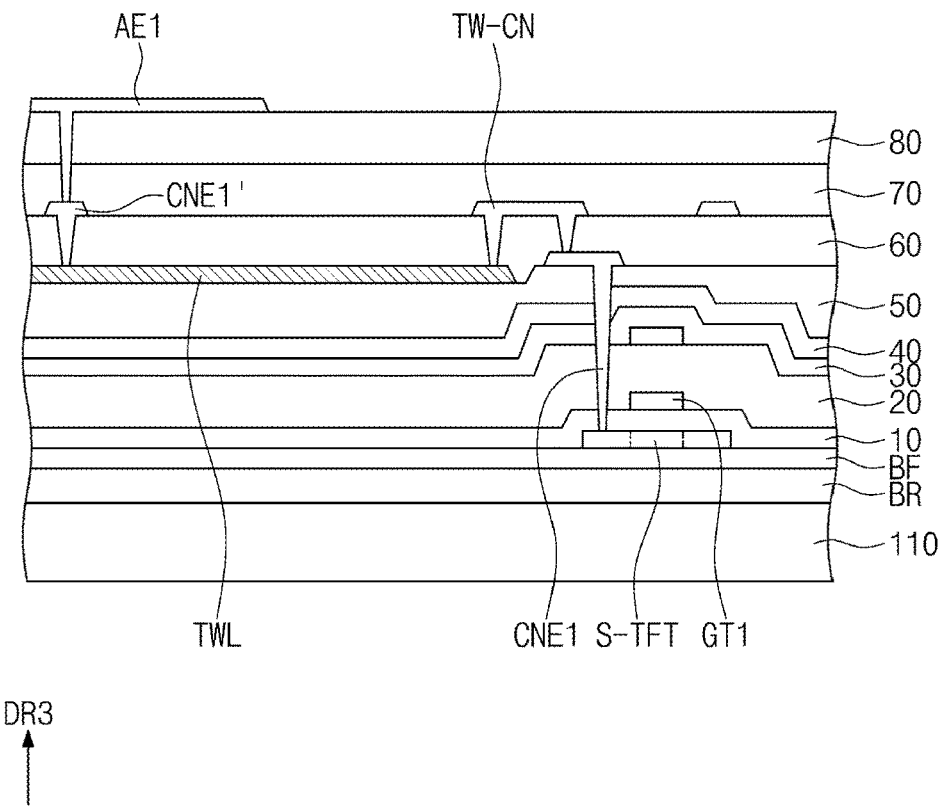
FIG. 13 is a cross-sectional view of a portion of the display panel of FIG. 2.

FIG. 13 is a cross-sectional view of a portion of the display panel DP according to an embodiment.

Referring to FIGS. 12 and 13, the first pixel electrode AE1 may be electrically connected to the first pixel circuit PC1 disposed in the second auxiliary display area ADA2. As an example, the first pixel electrode AE1 may be electrically connected to the first pixel circuit PC1 via the connection line TWL and a connection bridge TW-CN. In this case, the connection line TWL may overlap the transmission area. Accordingly, the connection line TWL may include a light transmissive material.

The connection line TWL may be disposed between the fifth insulating layer 50 and the sixth insulating layer 60, however, embodiments should not be particularly limited thereto. The connection bridge TW-CN may be disposed between the sixth insulating layer 60 and the seventh insulating layer 70. The connection bridge TW-CN may be connected to the connection line TWL and the first pixel circuit PC1.

The senser described with reference to FIGS. 5, 6, 7, 8A, 9, 10, and 11 may be disposed on the same layer as a layer (e.g., the fifth insulating layer 50) on which the connection line TWL is disposed. As an example, the sensor may include the same material as that of the connection line TWL and may be substantially simultaneously formed with the connection line TWL. In this case, the sensor may include a transparent material. Accordingly, the sensor SS may not be viewed from the outside.

Figure 14:
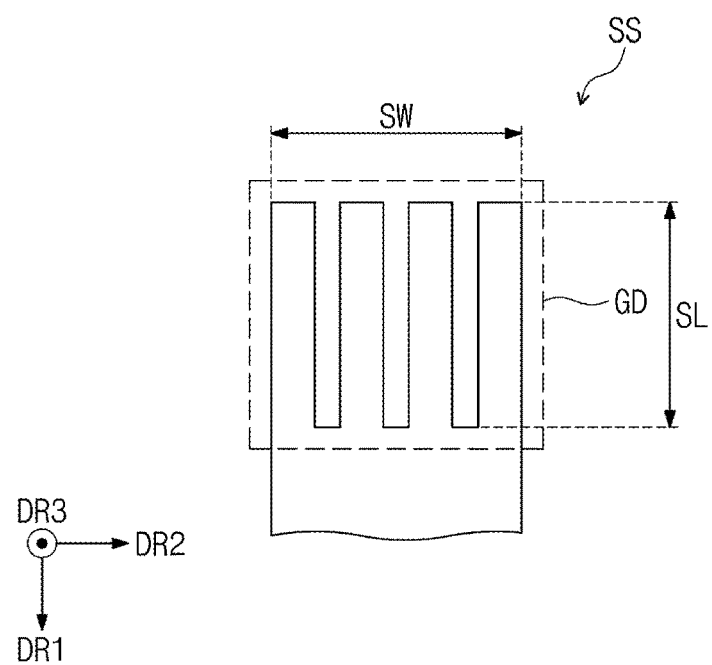
FIG. 14 is a plan view of a sensor of the display panel of FIG. 2.

FIG. 14 is a plan view of the sensor SS according to an embodiment.

Referring to FIG. 14, the sensor SS may be a strain gauge sensor that converts a force applied thereto into a change in electrical resistance and measures the change of the resistance. The sensor SS may include a grid GD. The strain may be measured by applying the change in value of the grid GD.

A length SL of the grid GD may be a length in a direction substantially parallel to the first direction DR1, and a width SW of the grid GD may be a width in a direction substantially parallel to the second direction DR2. A longitudinal direction of the grid GD may intersect the folding axis FX (refer to FIG. 1B). FIG. 14 shows a structure in which an extension direction, e.g., the second direction DR2, of the folding axis FX is substantially perpendicular to the longitudinal direction, e.g., the first direction DR1, of the grid GD as a representative example, however, embodiments should not be particularly limited thereto.

Figure 15:
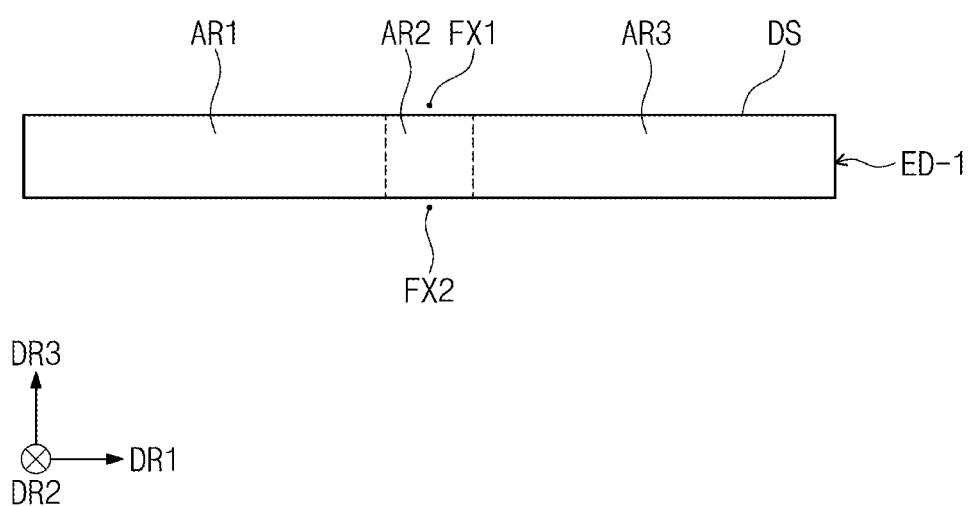
FIG. 15 is a cross-sectional view of the electronic device of FIG. 1.

FIG. 15 is a cross-sectional view of an electronic device ED-1 according to an embodiment.

Referring to FIG. 15, a first area AR1, a second area AR2, and a third area AR3 may be arranged in the first direction DR1, and an upper surface of the electronic device ED-1 may be a display surface DS. The electronic device ED-1 may be folded with respect to a first folding axis FX1 and may be folded with respect to a second folding axis FX2. In the case where the electronic device ED-1 is folded with respect to the first folding axis FX1, the electronic device ED-1 may be inwardly folded (e.g., inner-folding state) such that the display surface DS is not exposed to the outside, and in the case where the electronic device ED-1 is folded with respect to the second folding axis FX2, the electronic device ED-1 may be outwardly folded (e.g., outer-folding state) such that the display surface DS is exposed to the outside. For example, the electronic device ED-1 may selectively be inwardly folded or outwardly folded.

Figure 16A:
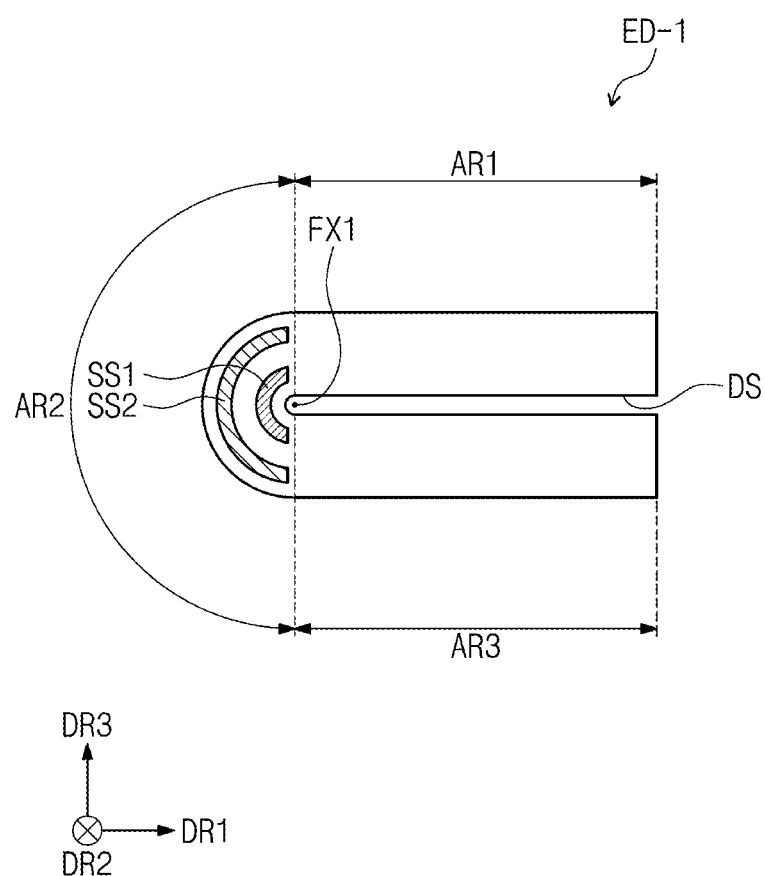
FIG. 16A is a cross-sectional view of the electronic device of FIG. 1 in a first folding state.
Figure 16B:
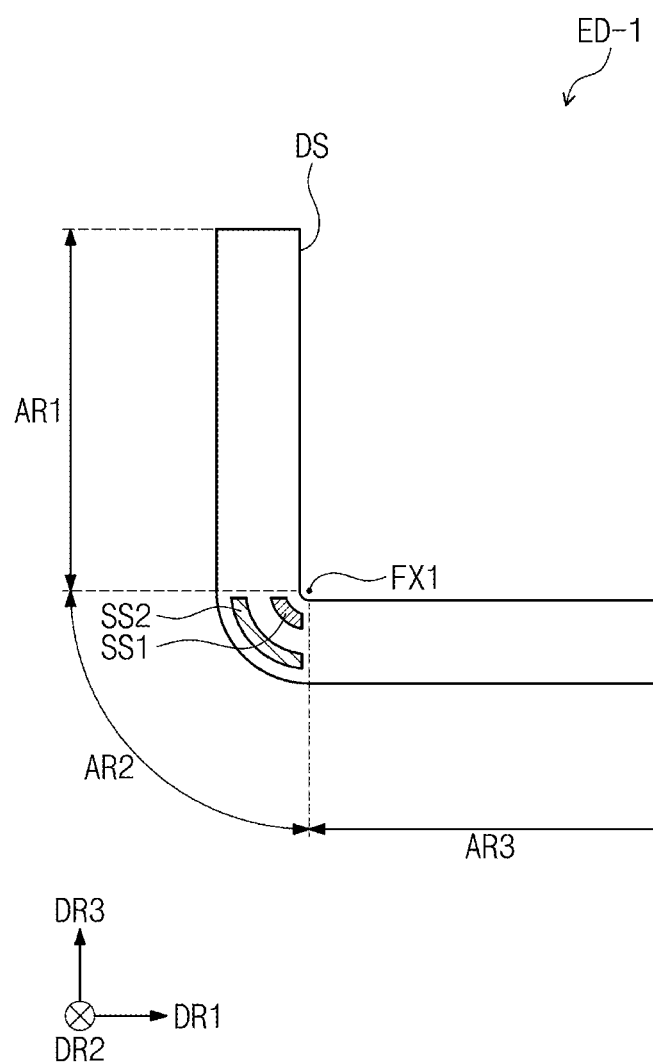
FIG. 16B is a cross-sectional view of the electronic device of FIG. 1 in a second folding state.
Figure 16C:
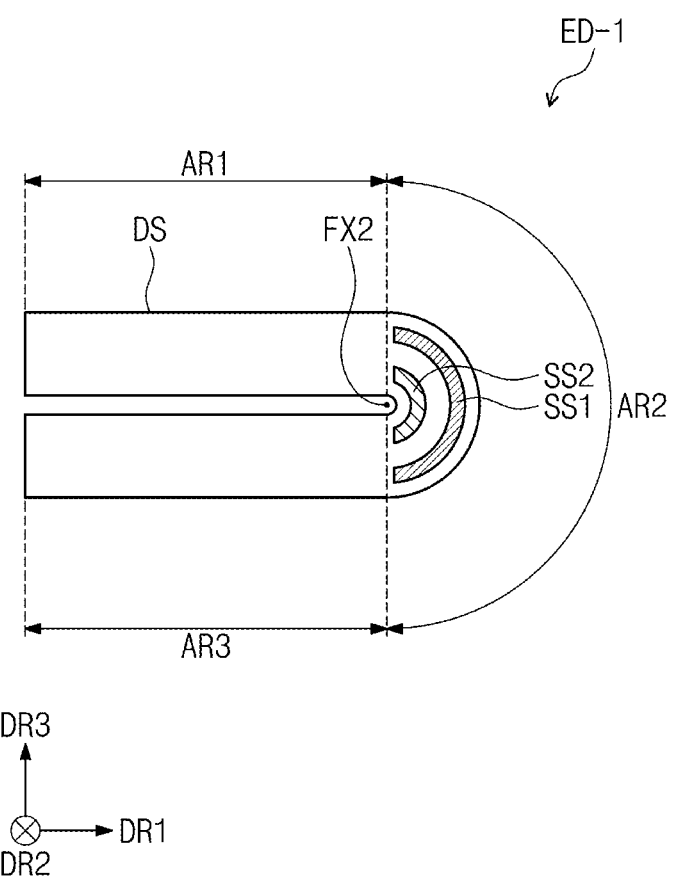
FIG. 16C is a cross-sectional view of the electronic device of FIG. 1 in a third folding state.

FIG. 16A is a cross-sectional view of the electronic device ED-1 in a first folding state according to an embodiment, FIG. 16B is a cross-sectional view of the electronic device ED-1 in a second folding state according to an embodiment, and FIG. 16C is a cross-sectional view of the electronic device ED-1 in a third folding state according to an embodiment.

Referring to FIGS. 16A and 16B, the second area AR2 may be folded with respect to the first folding axis FX1 substantially parallel to the second direction DR2. When the electronic device ED-1 is in the folded state, the second area AR2 may have a predetermined curvature and a radius of curvature. The first area AR1 and the third area AR3 may face each other, and the display surface DS may not be exposed to the outside.

A first sensor SS1 and a second sensor SS2 may be disposed spaced apart from each other in a thickness direction of the electronic device ED-1. When the second area AR2 is folded with respect to the first folding axis FX1, a resistance measured by the second sensor SS2 may be greater than a resistance measured by the first sensor SS1.

Referring to FIG. 16C, the second area AR2 may be folded with respect to the second folding axis FX2 substantially parallel to the second direction DR2. The first area AR1 and the third area AR3 may face each other, and the display surface DS may be exposed to the outside. When the second area AR2 is folded with respect to the second folding axis FX2, the resistance measured by the first sensor SS1 may be greater than the resistance measured by the second sensor SS2.

Referring to FIGS. 16A, 16B, and 16C, the sensors SS1 and SS2 may be electrically connected to a driver, and the driver may determine whether the second area AR2 is folded with respect to the first folding axis FX1 or the second folding axis FX2 based on a difference between the resistance measured by the first sensor SS1 and the resistance measured by the second sensor SS2 and may measure a folding degree. Then, the operation of the display device DD (refer to FIG. 2) may be controlled based on the measured result.

Figure 17:
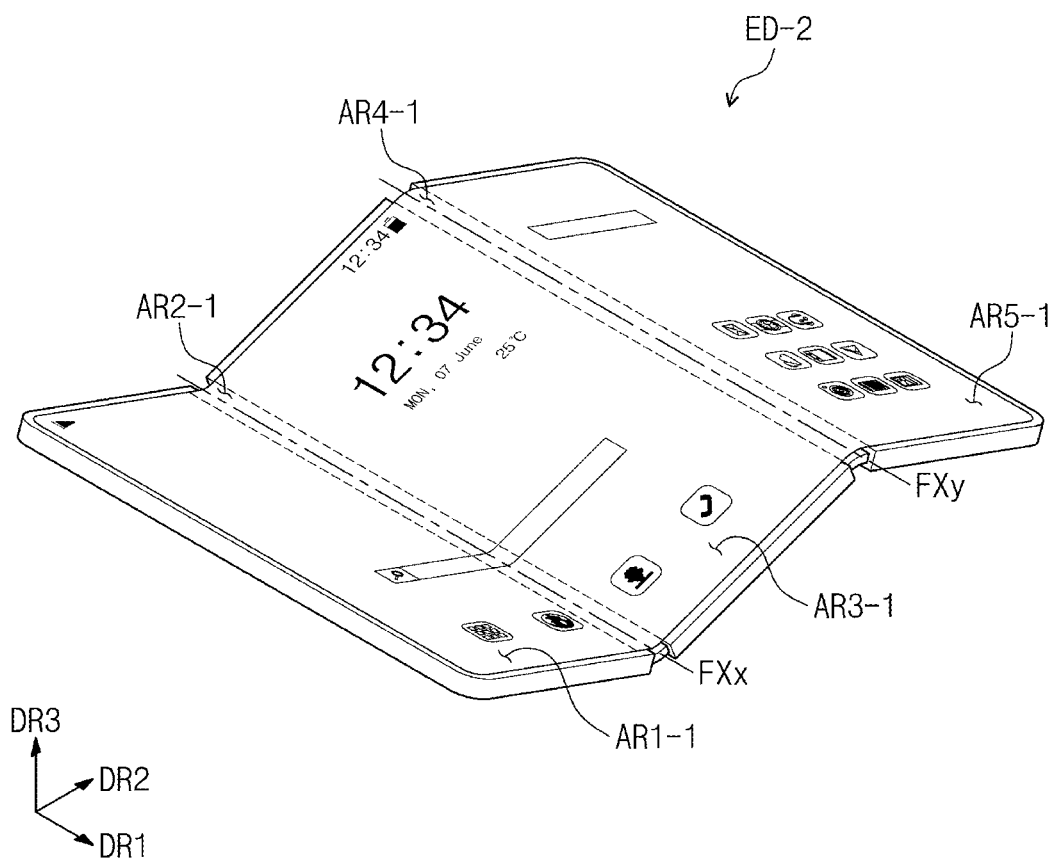
FIG. 17 is a perspective view of another embodiment of the electronic device of FIG. 1.

FIG. 17 is a perspective view of an electronic device ED-2 according to an embodiment.

Referring to FIG. 17, a first area AR1-1, a second area AR2-1, a third area AR3-1, a fourth area AR4-1, and a fifth area AR5-1 may be sequentially defined along the second direction DR2. The first area AR1-1, the third area AR3-1, and the fifth area AR5-1 may not be folded and may be referred to as non-folding areas. The second area AR2-1 and the fourth area AR4-1 may be folded or unfolded. Since the second area AR2-1 and the fourth area AR4-1 are foldable, the second area AR2-1 and the fourth area AR4-1 may be referred to as foldable areas or folding areas.

The second area AR2-1 may be folded with respect to a first folding axis FXx extending in the first direction DR1. The fourth area AR4-1 may be folded with respect to a second folding axis FXy extending in the first direction DR1.

When areas are distinguished from each other with respect to a display surface DS of the electronic device ED-2, the first folding axis FXx and the second folding axis FXy may be defined in different areas from each other. As an example, the first folding axis FXx may be defined on the display surface DS, and the second folding axis FXy may be defined under the display surface DS.

When the electronic device ED-2 is folded with respect to the first folding axis FXx defined on the display surface DS, the first area AR1-1 and the third area AR3-1 may face each other. When the electronic device ED-2 is folded with respect to the second folding axis FXy defined under the display surface DS, the third area AR3-1 and the fifth area AR5-1 may face each other. Accordingly, when the electronic device ED-2 is completely folded, the fifth area AR5-1 may be exposed to the outside.

The arrangement of the sensors shown in FIGS. 5 to 11 may be applied to the electronic device ED-2 of FIG. 17. As an example, the arrangement of the sensors of FIGS. 5 to 11 may be applied to an area overlapping the second area AR2-1 and an area overlapping the fourth area AR4-1.

Figure 18:
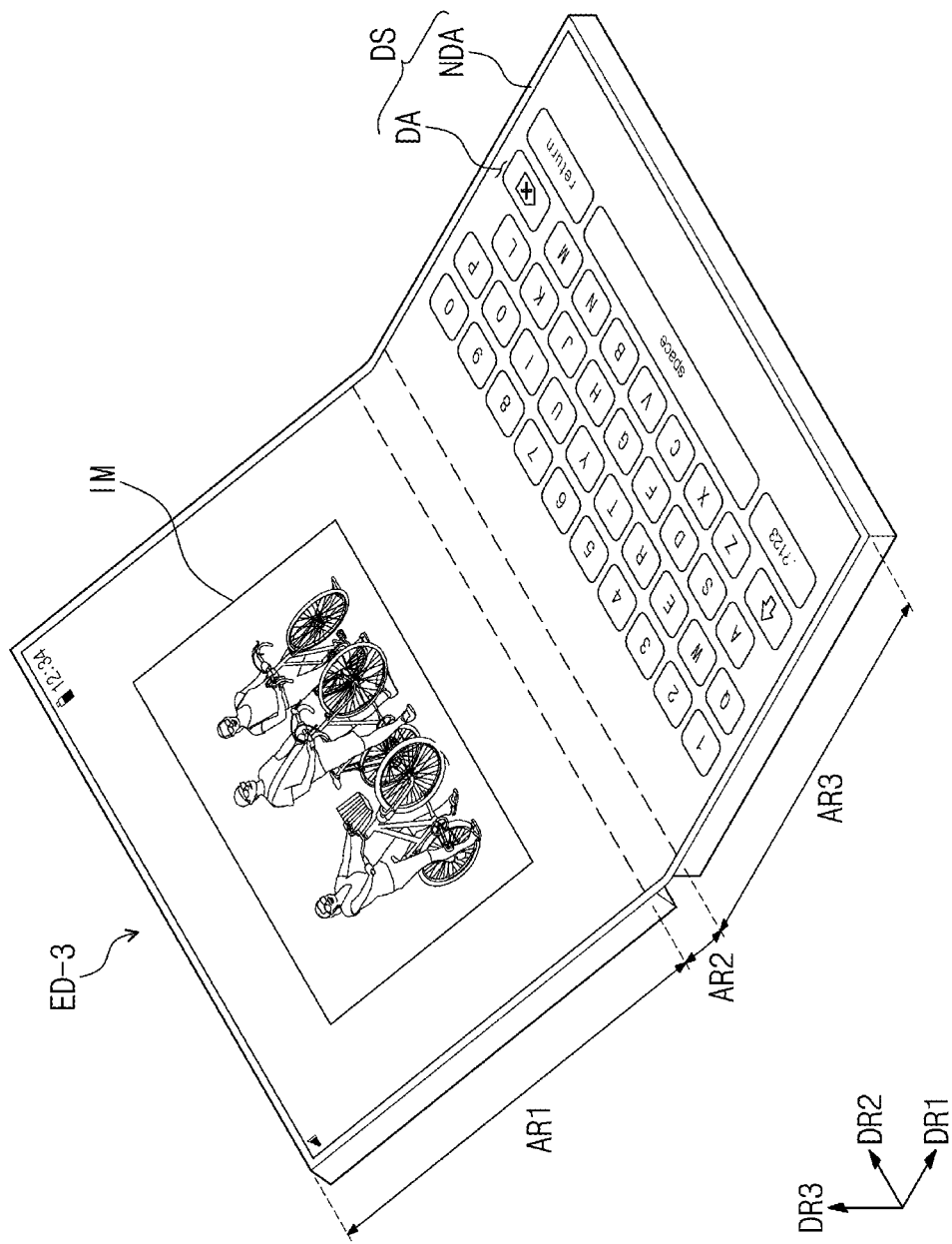
FIG. 18 is a perspective view of another embodiment of the electronic device of FIG. 1.

FIG. 18 is a perspective view of an electronic device ED-3 according to an embodiment.

Referring to FIG. 18, the electronic device ED-3 may provide an image IM to a user through a display surface DS. The display surface DS may include a display area DA and a non-display area NDA around the display area DA. The display area DA may display the image IM, and the non-display area NDA may not display the image IM. The non-display area NDA may surround the display area DA, however, embodiments should not be particularly limited thereto. According to an embodiment, a shape of the display area DA and a shape of the non-display area NDA may be changed.

FIG. 18 shows an example of the electronic device ED-3 in use. The electronic device ED-3 may be used in a folded state at a predetermined angle. In this case, a keyboard image may be displayed in a third area AR3. The electronic device ED-3 may be used as a tablet computer in an unfolded state and may be used as a notebook computer in the folded state at the predetermined angle.

The arrangement of the sensors shown in FIGS. 5 to 11 may be applied to the electronic device ED-3 of FIG. 18. As an example, the arrangement of the sensors of FIGS. 5 to 11 may be applied to an area overlapping a second area AR2 that corresponds to a folding area.

Figure 19:
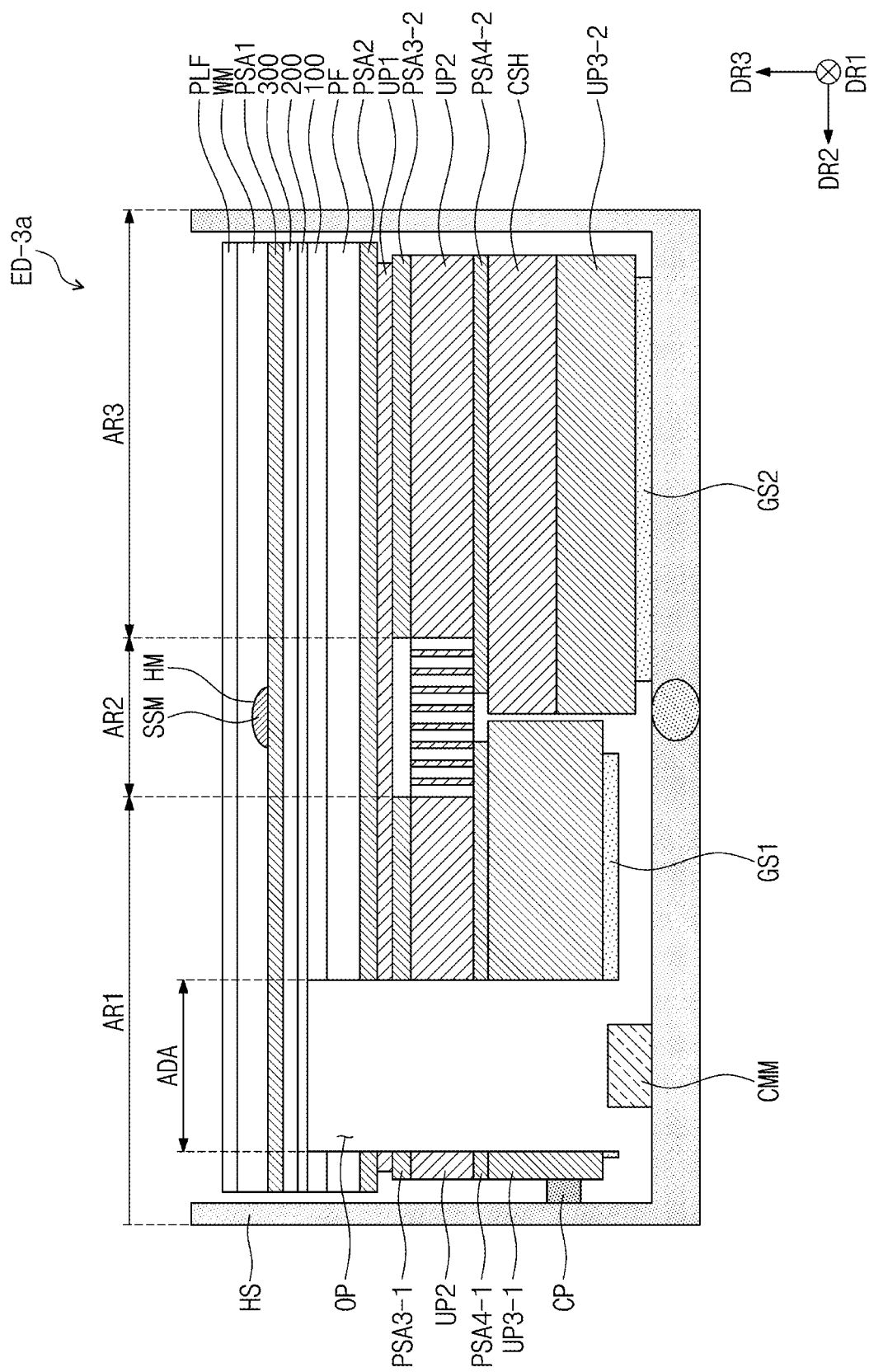
FIG. 19 is a cross-sectional view of another embodiment of the electronic device of FIG. 1.

FIG. 19 is a cross-sectional view of an electronic device ED-3a according to an embodiment.

Referring to FIG. 19, the electronic device ED-3a may include a protective film PLF, a window module WM, a plurality of pressure sensitive adhesive layers PSA1, PSA2, PSA3-1, PSA3-2, PSA4-1, and PSA4-2, an anti-reflective layer 300, a sensor layer 200, a display layer 100, a panel protective layer PPF, a plurality of lower members UP1, UP2, UP3-1, and UP3-2, a cushion layer CSH, a plurality of dissipation sheets GS1 and GS2, and a camera module CMM.

The window module WM may be disposed under the protective film PLF. The window module WM may include at least one base layer. The base layer may be a glass substrate or a polymer film. The window module WM may have a single-layer structure or a multi-layer structure. The window module WM may be provided with a recess HM defined in a lower surface thereof. The recess HM may be defined by removing a portion of the window module WM in a thickness direction of the window module WM. The recess HM may be defined in a portion overlapping a second area AR2.

A resin SSM may be provided in the recess HM of the window module WM. As the recess HM is defined in the window module WM to overlap the folding and unfolding portion of the window module WM, a folding reliability of the window module WM may be improved. The window module WM and the protective film PLF may be coupled to each other by an adhesive layer, and the adhesive layer and the protective film PLF may be separated from the window module WM to be replaced.

The protective film PLF may include polyimide, polycarbonate, polyamide, triacetylcellulose, polymethylmethacrylate, or polyethylene terephthalate. For example, at least one of a hard coating layer, an anti-fingerprint layer, and an anti-reflective layer may be disposed on an upper surface of the protective film PLF.

The pressure sensitive adhesive layers PSA1, PSA2, PSA3-1, PSA3-2, PSA4-1, and PSA4-2 may include a first pressure sensitive adhesive layer PSA1, a second pressure sensitive adhesive layer PSA2, third pressure sensitive adhesive layers PSA3-1 and PSA3-2, and fourth pressure sensitive adhesive layers PSA4-1 and PSA4-2. The first pressure sensitive adhesive layer PSA1 may be disposed between the window module WM and the anti-reflective layer 300 and may attach the window module WM to the anti-reflective layer 300. The second pressure sensitive adhesive layer PSA2 may be disposed between the panel protective layer PPF and a first lower member UP1 and may attach the panel protective layer PPF to the first lower member UP1. The third pressure sensitive adhesive layers PSA3-1 and PSA3-2 may be disposed between the first lower member UP1 and a second lower member UP2 and may attach the first lower member UP1 to the second lower member UP2. A fourth-first pressure sensitive adhesive layer PSA4-1 may be disposed between the second lower member UP2 and a third lower member UP3-1 and may attach the second lower member UP2 to the third lower member UP3-1. A fourth-second pressure sensitive adhesive layer PSA4-2 may be disposed between the second lower member UP2 and the cushion layer CSH and may attach the second lower member UP2 to the cushion layer CSH. A third-first pressure sensitive adhesive layer PSA3-1 and the fourth-first pressure sensitive adhesive layer PSA4-1 may have different adhesion ability from that of a third-second pressure sensitive adhesive layer PSA3-2 and the fourth-second pressure sensitive adhesive layer PSA4-2. As an example, an adhesion of the third-second and fourth-second pressure sensitive adhesive layers PSA3-2 and PSA4-2 may be stronger than an adhesion of the third-first and fourth-first pressure sensitive adhesive layers PSA3-1 and PSA4-1.

The display layer 100 may have a configuration that generates the image. The display layer 100 may be a light emitting type display layer. For example, the display layer 100 may be an organic light emitting display layer, an inorganic light emitting display layer, an organic-inorganic light emitting display layer, a quantum dot display layer, a micro-LED display layer, or a nano-LED display layer.

The sensor layer 200 may be disposed on the display layer 100. The sensor layer 200 may be referred to as a sensor, an input sensing layer, or an input sensing panel. The sensor layer 200 may sense an external input applied thereto from the outside. The external input may be a user input. The user input may include a variety of external inputs, such as a part of user's body, light, heat, pen, or pressure.

The anti-reflective layer 300 may be disposed on the sensor layer 200.

The panel protective layer PPF may be disposed under the display layer 100. The panel protective layer PPF may protect a lower portion of the display layer 100. The panel protective layer PPF may include a flexible plastic material. The panel protective layer PPF may prevent scratches from occurring on a rear surface of the display layer 100 during a manufacturing process of the display layer 100. The panel protective layer PPF may be a colored polyimide film. For example, the panel protective layer PPF may be an opaque yellow film, however, embodiments should not be limited thereto or thereby.

The lower members UP1, UP2, UP3-1, and UP3-2 may include the first lower member UP1, the second lower member UP2, the third-first lower member UP3-1, and the third-second lower member UP3-2. The first lower member UP1 may be disposed under the panel protective layer PPF. The first lower member UP1 may increase a resistance to a compressive force caused by an external pressure. Accordingly, the first lower member UP1 may prevent the display layer 100 from being deformed. The first lower member UP1 may include a flexible plastic material, such as polyimide or polyethylene terephthalate.

In addition, the first lower member UP1 may absorb a light incident thereto from the outside. The first lower member UP1 may include a light blocking material or may be a colored film with low light transmittance. As an example, the first lower member UP1 may be a black plastic film, e.g., a black polyimide film. When looking at the display layer 100 from an upper side of the window module WM, components disposed under the first lower member UP1 may not be viewed by the user.

The second lower member UP2 may be disposed under the first lower member UP1. The second lower member UP2 may support components disposed on the second lower member UP2 and may maintain the unfolded state and the folded state of the electronic device ED-3a. According to an embodiment, the second lower member UP2 may include a first support portion corresponding to a first area AR1 that is a non-folding area, a folding portion corresponding to a second area AR2 that is a folding area, and a second support portion corresponding to a third area AR3 that is the non-folding area. The first support portion and the second support portion may be spaced apart from each other in the second direction DR2. The folding portion may be disposed between the first support portion and the second support portion and may be provided with a plurality of openings defined therethrough. Due to the openings, a flexibility of a portion of the second lower member UP2 may be improved.

The second lower member UP2 may include a carbon fiber reinforced plastic (CFRP), however, embodiments should not be limited thereto or thereby. The first and second support portions may include a non-metallic material, a plastic material, a glass fiber reinforced plastic, or a glass material. The plastic material may include polyimide, polyethylene, or polyethylene terephthalate, however, embodiments should not be particularly limited thereto. The first support portion and the second support portion may include the same material as each other. The folding portion may include the same material as that of the first support portion and the second support portion or may include a different material from that of the first support portion and the second support portion. As an example, the folding portion may include a material having an elastic modulus equal to or greater than about 60 GPa and may include a metal material such as a stainless steel. For example, the folding portion may include SUS 304, however, embodiments should not be limited thereto or thereby. The folding portion may include a variety of metal materials.

In an area overlapping the second area AR2, the first lower member UP1 may be spaced apart from the second lower member UP2. For example, an empty space may be defined between the second lower member UP2 and the first lower member UP1 in the area overlapping the second area AR2.

Since the empty space is defined between the first lower member UP1 and the second lower member UP2, the openings defined through the second lower member UP2 may not be viewed from the outside of the electronic device ED-3a when the electronic device ED-3a is folded.

In addition, since the first lower member UP1 may include the light blocking material or may be the colored film with low light transmittance, a color difference between areas of the second lower member UP2 may not be viewed from the outside. As an example, a color difference between a first support area of the second lower member UP2 through which the openings are defined and a second support area of the second lower member UP2 through which the openings are not defined may not be viewed from the outside. The first support area may overlap the folding area, and the second support area may overlap the first area AR1 and the third area AR3.

The cushion layer CSH may be disposed under the second lower member UP2. A portion of the cushion layer CSH may overlap some of the openings. The cushion layer CSH may absorb an external impact to protect the display layer 100. The cushion layer CSH may include a foam sheet having a predetermined elasticity. The cushion layer CSH may include a sponge or polyurethane. The cushion layer CSH may be provided in an area overlapping the third area AR3.

The third-first lower member UP3-1 may be disposed under the second lower member UP2. The third-second lower member UP3-2 may be disposed under the cushion layer CSH. The third-first lower member UP3-1 and the third-second lower member UP3-2 may absorb external impacts applied thereto from a lower side thereof.

The dissipation sheets GS1 and GS2 may include a first dissipation sheet GS1 and a second dissipation sheet GS2. The first dissipation sheet GS1 may be disposed under the third-first lower member UP3-1, and the second dissipation sheet GS2 may be disposed under the third-second lower member UP3-2. The dissipation sheets GS1 and GS2 may dissipate heat generated by electronic components disposed thereunder. The dissipation sheets GS1 and GS2 may have a structure in which an adhesive layer and a graphite layer are alternately stacked, however, embodiments should not be particularly limited thereto. The dissipation sheets GS1 and GS2 may improve heat dissipation properties and may also have electromagnetic wave shielding or electromagnetic wave absorption properties.

The camera module CMM may take a photo or a video. The camera module CMM may be provided in plural. Among them, some camera modules CMM may overlap an auxiliary display area ADA. The external input, for example, a light, may be provided to the camera module CMM via the auxiliary display area ADA. As an example, the camera module CMM may receive a natural light through the auxiliary display area ADA to take a picture of an external object.

An opening OP may be defined to overlap the camera module CMM. The opening OP may have a size determined by taking into account a position of a sidewall that defines the opening OP deformed when the electronic device ED-3a is folded and unfolded. A connection member CP may connect a housing HS and an inner structure of the electronic device ED-3a. The connection member CP may connect one end of the third-first lower member UP3-1 and the housing HS. The connection member CP may include a material with an elasticity. FIG. 19 shows the structure in which the third-first lower member UP3-1 is connected to the connection member CP as a representative example, however, embodiments should not be particularly limited thereto.

The arrangement of the sensors shown in FIGS. 5 to 11 may be applied to the electronic device ED-3a of FIG. 19. As an example, the arrangement of the sensors of FIGS. 5 to 11 may be applied to an area overlapping the second area AR2 that corresponds to the folding area.

Figure 20:
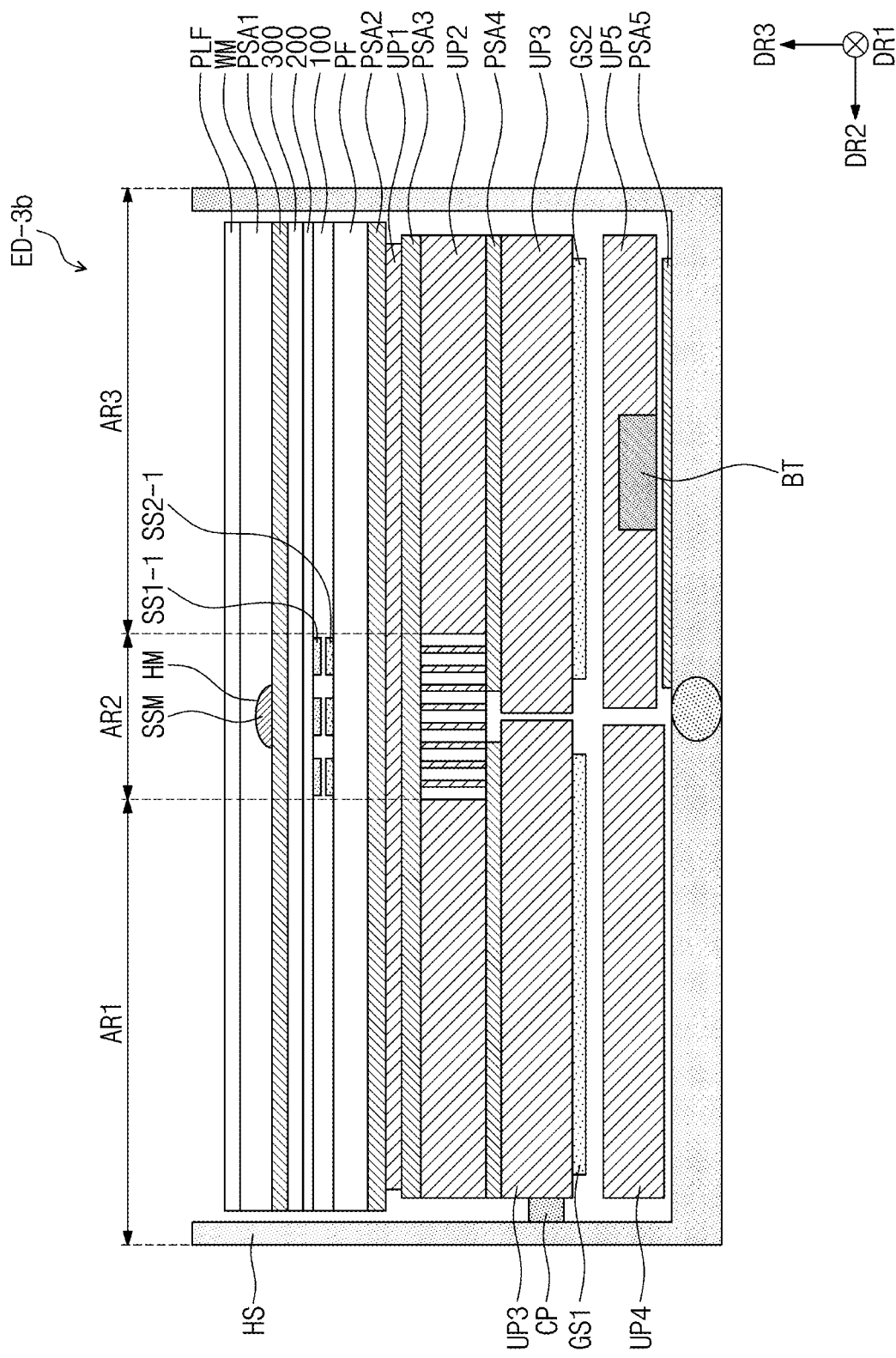
FIG. 20 is a cross-sectional view of another embodiment of the electronic device of FIG. 1.

FIG. 20 is a cross-sectional view of an electronic device ED-3b according to an embodiment. In FIG. 20, the same reference numerals denote the same elements described with reference to FIG. 19, and thus, redundant descriptions of the same elements will be omitted for descriptive convenience.

A third lower member UP3 may be disposed between a first dissipation sheet GS1 and a fourth pressure sensitive layer PSA4 and between the second dissipation sheet GS2 and the fourth pressure sensitive layer PSA4. The third lower member UP3 may absorb external impacts applied thereto from a lower side thereof.

A fourth lower member UP4 may be disposed under the first dissipation sheet GS1. The fourth lower member UP4 may be referred to as an intermediate frame.

A fifth lower member UP5 may be disposed under the first dissipation sheet GS1. A fifth pressure sensitive adhesive layer PSA5 may be disposed between the fifth lower member UP5 and a housing HS and may attach the fifth lower member UP5 to the housing HS. The fifth lower member UP5 may be provided to place a battery BT. The battery BT may supply a power to the electronic device ED-3b.

A plurality of sensors SS1-1 and SS2-1 may be disposed to overlap a display layer 100 and a second area AR2. The sensors SS1-1 and SS2-1 may include a first sensor SS1-1 and a second sensor SS2-1. The first sensor SS1-1 and the second sensor SS2-1 may be disposed to be spaced apart from each other in the third direction DR3. FIG. 20 shows three first sensors SS1-1 and three second sensors SS2-1 as a representative example, however, the number of the first sensors SS1-1 and the number of the second sensors SS2-1 should not be particularly limited thereto. As an example, as a folding area of the electronic device ED-3b increases, the number of the sensors disposed in the second area AR2 may increase. In addition, two sensors are arranged in the third direction DR3 as shown in FIG. 20, however, three or more sensors may be arranged in the third direction DR3 according to the purpose of the electronic device ED-3b.

The arrangement of the sensors shown in FIGS. 5 to 11 may be applied to the electronic device ED-3b of FIG. 20. As an example, the arrangement of the sensors of FIGS. 5 to 11 may be applied to an area overlapping the second area AR2 that corresponds to the folding area.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An electronic device comprising:
a substrate comprising a first area, a second area adjacent to the first area in a first direction and foldable, and a third area adjacent to the second area in the first direction;
a circuit layer disposed on the substrate, the circuit layer comprising a plurality of insulating layers, a plurality of conductive layers, and at least one semiconductor layer;
a light emitting element layer disposed on the circuit layer and comprising a light emitting element;
an encapsulation layer disposed on the light emitting element layer; and
a sensor layer disposed on the encapsulation layer and comprising a plurality of sensor conductive layers, the sensor layer for sensing an external input, wherein:
a first layer is a single layer selected from among the plurality of conductive layers, the at least one semiconductor layer, and the plurality of sensor conductive layers, the first layer comprising a first sensor,
a second layer is a single layer, different from the first layer, selected from among the plurality of conductive layers, the at least one semiconductor layer, and the plurality of sensor conductive layers, the second layer comprising a second sensor,
the first sensor and the second sensor overlap the second area, and
the first sensor has an elasticity or a rigidity that is different from an elasticity or a rigidity of the second sensor.

2. The electronic device of claim 1, wherein the first sensor is spaced apart from the second sensor in the first direction when viewed in a plane.

3. The electronic device of claim 1, wherein the first sensor is spaced apart from the second sensor in a second direction intersecting the first direction when viewed in a plane.

4. The electronic device of claim 1, wherein one of the first layer and the second layer further comprises a third sensor, and
wherein the third sensor is spaced apart from the first sensor and the second sensor.

5. The electronic device of claim 4, wherein the third sensor overlaps the second area.

6. The electronic device of claim 1, wherein the at least one semiconductor layer comprises:
a first semiconductor layer comprising a silicon semiconductor; and
a second semiconductor layer comprising an oxide semiconductor.

7. The electronic device of claim 1, wherein:
the second sensor is disposed more adjacent to the third area than the first sensor when viewed in a plane, and
the second sensor has a rigidity greater than a rigidity of the first sensor.

8. The electronic device of claim 1, wherein:
the first layer is disposed between the second layer and the substrate, and
the first sensor has an elasticity greater than an elasticity of the second sensor.

9. The electronic device of claim 1, wherein the first sensor has a length greater than a length of the second sensor in the first direction.

10. The electronic device of claim 1, wherein the first sensor has a length greater than a length of the second sensor in a second direction intersecting the first direction.

11. The electronic device of claim 1, wherein the circuit layer further comprises a pixel circuit electrically connected to the light emitting element and a connection line connecting the light emitting element to the pixel circuit, wherein:
the connection line comprises a light transmissive material, and
the first sensor or the second sensor is disposed on a same layer as a layer on which the connection line is disposed.

12. The electronic device of claim 1, wherein the second area is folded with respect to a first folding axis defined on the substrate or folded with respect to a second folding axis defined under the substrate.

13. The electronic device of claim 12, further comprising a driver electrically connected to the first sensor and the second sensor,
wherein the driver is configured to determine whether the second area is folded with respect to the first folding axis or the second folding axis based on signals measured by the first sensor and the second sensor.

14. The electronic device of claim 1, wherein each of the first sensor and the second sensor is a strain gauge sensor.

15. An electronic device comprising:
a display layer comprising a substrate comprising:
a first area, a second area adjacent to the first area in a first direction and foldable, and a third area adjacent to the second area in the first direction,
a circuit layer disposed on the substrate, the circuit layer comprising a plurality of insulating layers, a plurality of conductive layers, and at least one semiconductor layer,
a light emitting element layer disposed on the circuit layer, the light emitting element layer comprising a light emitting element, and
an encapsulation layer disposed on the light emitting element layer;
a sensor layer disposed on the display layer and comprising a plurality of sensor conductive layers, the sensor layer for sensing an external input;
a first sensor included in a first layer that is a single layer selected from among the conductive layers, the at least one semiconductor layer, and the sensor conductive layers; and
a second sensor included in a second layer that is a single layer, different from the first layer, selected from among the conductive layers, the at least one semiconductor layer, and the sensor conductive layers, wherein
the first layer is disposed between the second layer and the substrate, and
the first sensor has an elasticity or rigidity different from an elasticity or rigidity of the second sensor.

16. The electronic device of claim 15, wherein the display layer further comprises a main display area, a first auxiliary display area, and a second auxiliary display area, the display layer comprises:
a first pixel comprising a first light emitting element disposed in the first auxiliary display area and a first pixel circuit electrically connected to the first light emitting element and disposed in the second auxiliary display area;
a second pixel comprising a second light emitting element disposed in the second auxiliary display area and a second pixel circuit electrically connected to the second light emitting element and disposed in the second auxiliary display area;
a third pixel comprising a third light emitting element disposed in the main display area and a third pixel circuit electrically connected to the third light emitting element and disposed in the main display area; and a connection line connecting the first light emitting element to the first pixel circuit, wherein one of the first sensor and the second sensor is disposed on a same layer as a layer on which the connection line is disposed and comprises a same material as the connection line.

17. The electronic device of claim 15, wherein the first sensor is spaced apart from the second sensor in the first direction when viewed in a plane.

18. The electronic device of claim 15, wherein the first sensor is spaced apart from the second sensor in a second direction intersecting the first direction when viewed in a plane.

* * * * *